(12) United States Patent
Catthoor et al.

(10) Patent No.: US 10,386,878 B2
(45) Date of Patent: Aug. 20, 2019

(54) RECONFIGURABLE PV CONFIGURATION

(71) Applicant: IMEC VZW, Leuven (BE)

(72) Inventors: Francky Catthoor, Temse (BE); Maria-Iro Baka, Kantza Pallini Athens (GR)

(73) Assignee: IMEC VZW, Leuven (BE)

( * ) Notice: Subject to any disclaimer, the term of this patent is extended or adjusted under 35 U.S.C. 154(b) by 693 days.

(21) Appl. No.: 14/354,012

(22) PCT Filed: Oct. 5, 2012

(86) PCT No.: PCT/EP2012/069727
§ 371 (c)(1),
(2) Date: Apr. 24, 2014

(87) PCT Pub. No.: WO2013/060564
PCT Pub. Date: May 2, 2013

(65) Prior Publication Data
US 2014/0312700 A1 Oct. 23, 2014

Related U.S. Application Data

(60) Provisional application No. 61/562,085, filed on Nov. 21, 2011.

(30) Foreign Application Priority Data

Oct. 24, 2011 (EP) .................................. 11186415

(51) Int. Cl.
*G05F 1/67* (2006.01)
*H01L 31/02* (2006.01)
*H02J 1/00* (2006.01)

(52) U.S. Cl.
CPC .......... *G05F 1/67* (2013.01); *H01L 31/02021* (2013.01); *H02J 1/00* (2013.01); *Y02E 10/50* (2013.01); *Y10T 307/685* (2015.04)

(58) Field of Classification Search
CPC ........ G05F 1/67; H02J 1/00; H01L 31/02021; Y10T 307/685; Y02E 10/50
See application file for complete search history.

(56) References Cited

U.S. PATENT DOCUMENTS 4,175,249 A * 11/1979 Gruber ...................... G05F 1/67
136/293
8,115,340 B2 * 2/2012 Takehara ................ H02J 3/383
307/71

(Continued)

FOREIGN PATENT DOCUMENTS

WO 2005/112551 A1 12/2005
WO 2010/070621 A1 6/2010
WO WO2010070621 * 6/2010

OTHER PUBLICATIONS

PCT International Search Report and Written Opinion, PCT International Application No. PCT/EP2012/069727, dated Jun. 3, 2013.

(Continued)

*Primary Examiner* — Jared Fureman
*Assistant Examiner* — Emmanuel Dominique
(74) *Attorney, Agent, or Firm* — McDonnell Boehnen Hulbert & Berghoff LLP

(57) ABSTRACT

A PV module is described with an array of PV cells whereby the module is reconfigurable, allowing different configurations to be applied after installation and during operation, i.e. at run-time. The run time configuration of the module has controllable devices. The main controllable devices are any of (individually or in combination): a) switches which determine the parallel/series connections of the cells as well as hybrid cases also. b) switches between the cells and local dc/dc converters and/or among the DC/DC converters; c) actively controlled bypass diodes placed in order to allow excess current to flow in the occurrence of a mismatch.

16 Claims, 25 Drawing Sheets

(56) References Cited

U.S. PATENT DOCUMENTS

| | | | | |
|---|---|---|---|---|
| 8,829,715 B2* | 9/2014 | Agamy | ............... | H02J 3/385 307/71 |
| 9,136,710 B1* | 9/2015 | Baker | ............... | H02J 3/385 |
| 2007/0119718 A1* | 5/2007 | Gibson | ............... | C25B 1/04 205/637 |
| 2009/0079412 A1* | 3/2009 | Kuo | ............... | H01L 31/02008 323/299 |
| 2010/0089431 A1* | 4/2010 | Weir | ............... | G05F 1/67 136/244 |
| 2010/0198424 A1 | 8/2010 | Takehara et al. | | |
| 2010/0301676 A1* | 12/2010 | Hernandez | ............... | H02M 3/337 307/82 |
| 2011/0031816 A1* | 2/2011 | Buthker | ............... | H01L 31/02021 307/82 |
| 2011/0140532 A1 | 6/2011 | Cherukupalli | | |
| 2011/0144822 A1* | 6/2011 | Choi | ............... | H02J 3/32 700/297 |
| 2012/0112557 A1* | 5/2012 | Sager | ............... | H01L 31/02021 307/112 |
| 2012/0313455 A1* | 12/2012 | Latham | ............... | H01L 31/02021 307/117 |
| 2013/0033112 A1* | 2/2013 | Thompson | ............... | H01L 31/02021 307/71 |
| 2013/0058140 A1* | 3/2013 | Victor | ............... | H01L 31/02021 363/56.01 |
| 2013/0241294 A1* | 9/2013 | Cleland | ............... | H02J 3/383 307/71 |

OTHER PUBLICATIONS

Velasco, Guillermo et al., "Grid-Connected PV Systems Energy Extraction Improvement by Means of an Electric Array Reconfiguration (EAR) Strategy: Operating Principle and Experimental Results", IEEE Power Electronics Specialists Conference, Jun. 15-19, 2008, pp. 1983-1988.

Gheorghita, S.V. et al., "System Scenario Based Design of Dynamic Embedded Systems", ACM Transactions on Design Automation of Electronic Systems, vol. 14, No. 1, Jan. 2009, Article No. 3, pp. 1-44.

* cited by examiner

RECONFIGURABLE PV CONFIGURATION

CROSS-REFERENCE TO RELATED APPLICATIONS

The present application is a U.S. national stage application of International Application Serial No. PCT/EP2012/069727 filed Oct. 5, 2012, which claims priority to European Patent Application No. 11186415.3 filed Oct. 24, 2011 and U.S. Provisional Patent Application No. 61/562,085 filed Nov. 21, 2011, the contents of each of which are hereby incorporated by reference.

TECHNICAL FIELD

The present invention relates to PV (Photovoltaic) modules, arrangements and installations, and to methods of designing and constructing such PV modules.

BACKGROUND ART

A photovoltaic system (or PV system) is a system which uses many solar cells usually in the form of one or more solar panels to convert sunlight into electricity. It can comprise multiple components, including photovoltaic modules, mechanical and electrical connections and mountings and means of regulating and/or modifying the electrical output as well as means to track the sun. The efficiency of the solar system is reduced during dynamic conditions by time-dependent effects. The efficiency of today's power circuits is high, although the overall efficiency is strongly affected from varying factors such as partial shading. In rooftop applications these problems become more important. Known configurations that are used in today's systems are not dealing with these problems effectively during operation, i.e. at the run-time of the system. Maximum power point tracking (MPPT) is a technique that solar inverters use to get the maximum possible power from the PV system. Solar cells have a complex relationship between solar irradiation, temperature and total resistance that produces a non-linear output efficiency known as the I-V curve. It is the purpose of the MPPT system to sample the output of the cells and apply a resistance (load) to obtain maximum power for any given environmental conditions. Essentially, this defines the current that the inverter should draw from the PV system in order to get the maximum possible power. The MPP tracker is vital for a large number of modules, making the module mismatching a crucial factor. Even when the control is decentralized at the module level, the efficiency is further reduced and reliability issues make these configurations inefficient.

WO2005/112551 describes an auxiliary power source connected to each PV module of series connected strings. In case of partial shading, this source supplies the necessary power in order to prevent a temporary shut-down. The MPPT controls the switches of the power source.

Modules which are widely used nowadays are uniform. All cells of commercial modules are permanently connected in series and the controls of the system are mainly situated in the central or local converters. As the excitation of the PV system is not uniform (e.g. non-uniform irradiation, and/or temperature), a small group of cells can cause the module to operate well below optimum. In the case of total destruction or shading of some cells, the whole module is potentially disconnected from the system leading to a significant loss of power. In the literature, several proposals are introduced which use more controls than purely in the converter. They focus mainly on adding local control at the module level. Dynamic interconnections of the cells within the module have been introduced as well. Known module configurations are however uniform. Some studies propose switches between the cells, enabling all possible connections of a solar cell with neighboring cells in a uniform way. This number of connections leads to a large overhead in terms of both long wires and many switches. This is not considered acceptable from a fabrication cost point of view. There has been little effort to connect cells which are not neighboring. Known configurations exhibit uniform topologies with symmetry rules.

US20090079412 describes an apparatus and method controlling the output of a PV array which disclose that a high enough output voltage can be obtained by uniformly switching N parallel connected cell strings into N/M parallel connected groups of M times longer cell strings. Every MPTT or controller is purely locally driven, even when it is conceptually used in an intra-module manner. It is noticeable in the array that there are long conductors which span from one end of strings of cells to the other.

SUMMARY OF THE DISCLOSURE

An object of the present invention is to provide a smart PV module and method of designing the same. An advantage of embodiments of the present invention is an increase in the performance such as a better energy-yield of the PV system. For example, it has been found that a useful cost function which can be used to evaluate different configurations of the module is a three dimensional objective space of restricted production and maintenance cost, increased yearly energy yield, and increased life time.

The above object is achieved by a PV module with an array of PV cells whereby the module is reconfigurable, allowing different configurations to be applied after installation and during operation, i.e. at run-time. The run time configuration of the module has controllable devices. The main controllable devices are any of (individually or in combination):

a) switches which determine the parallel/series connections of the cells as well as hybrid cases also.

b) switches between the cells and local dc/dc converters and/or among the DC/DC converters;

c) actively controlled bypass diodes placed in order to allow excess current to flow in the occurrence of a mismatch.

As the placement of switches in every individual cell would lead to a large overhead, some cells are interconnected permanently in series, i.e. as substrings. When the array is Cartesian in form, a substring can be either a column or a row of the module. Where further refinement is required the columns and rows can be further divided, i.e. by a vertical split of the column or horizontal split of the row.

The present invention provides a reconfigurable arrangement of photovoltaic cells in a module having at least one DC-DC converter connectable to the cells, comprising:

the cells being non-divisably joined in series in substrings of at least two cells, the arrangement having an initial topology and a run-time topology, both the initial topology and the run-time topology being non-uniform, and means to reconfigure the arrangement at run-time by forming parallel and/or series connections of the substrings, whereby not all parallel or series connections, e.g. not all parallel or series connections of groupings with DC converters can be reached by the reconfigurable arrangement, wherein the reconfigurable arrangement can respond to non-uniform photonic stimulation by a non-uniform re-arrangement of the sub-strings (e.g. in the groupings) and/or of the at least one DC-converter.

The means to reconfigure can comprise first switches operable to form the parallel and/or series connections of substrings in groupings.

The arrangement can include a plurality of DC-DC converters, wherein the means to reconfigure comprise second switches located between the substrings and the DC-DC converters.

The means to reconfigure may preferably comprise third switches located between the DC-DC converters.

Features of the present invention are: non-uniformity of the arrangement, flexible or hybrid series or parallel substring connections, placement of the local DC/DC converters, vertical split options of the cells and strings, and active controlled bypass diodes any or all of which can be combined in a very flexible way to increase the overall efficiency of the module.

Most of the following aspects of embodiments of the present invention result in a non-symmetric or non-uniform module:

a) the design has wired connections to converters mainly or completely on one side of the module, e.g. for the hybrid substring connections, as a consequence there are more connections to substrings on the same side as where most or all of the converters are located.
b) For the hybrid substring connections, wired connections do not cross from one side of a module to another—this reduces total wire length used and the cost.
c) Typically connections between up going and down going substrings are normally paired. In that case the switches are typically only at the bottom where most or all of the converters are placed and fixed connections are at the top.
d) Per DC converter a grouping can be decided starting from the hybrid substring connections wherein the non-uniform stimuli conditions are used to identify a non-uniform subset of substrings.
e) Limit the length of wire connections,
f) DC/DC converters are placed mainly or completely on one side of a module. This results in a non-symmetric or non-uniform module.
g) If there is a connection of the DC/DC converters on one side then preferably there is an even number of substrings. Otherwise even and odd number of strings is allowed.
h) The number of DC/DC converters is half or less than the number of substrings. This reduces cost.
i) In addition to a connection to a grouping of substrings, DC/DC converters can be connected in series by switches.
j) The module can be split in a non-uniform vertical split.
k) With a vertical split converters can be placed on one or both sides of a module.
l) With a vertical split no converters need be placed in the middle between the split parts of the module.
m) Bypass diodes can be used, especially actively controlled bypass diodes.
n) Bypass diodes may be used to provide a bypass across a group, a string or for connecting neighboring strings.

In embodiments of the present invention a reconfigurable non-symmetric configuration is provided comprising one or more modules, such as photovoltaic modules, and a controller,
wherein the controller is adapted to optimize performance real-time in terms of two or more predetermined design templates matching a layout of the configuration,
wherein each module comprises an array of N by M cells, N, M both being larger than 2, each module comprising elements selected from a group comprising or consisting of a DC-converter, an active (or passive) bypass diode, a switch, a cell, and a connector, wherein:
at least one first group of cells is connected in series as a substring and/or at least one second group of cells is connected in parallel, and/or
at least one third group of one or more DC-converters are provided,
and optionally comprising one or more of:
at least one fourth group of one or more bypasses, and/or
at least one fifth group of one or more switches, switches can be arranged between a DC-DC converter and a substring and/or between substrings in different combinations like series, parallel, symmetric and asymmetric,
at least one sixth group of cells comprising one or more connectors,
(wherein each group of cells is functionally inter-related),
wherein each module in use provides an output.

The present invention also provides a method of operating a reconfigurable arrangement as described above, comprising the steps of:
determining functional cells,
calculating optimal performance, and
reconfiguring the configuration by closing and/or opening one or more switches. The reconfigurable arrangement is determined preferably from a design template.

The present invention also includes a computer program product having instructions to be executed on a computer to perform a method described above.

The computer program product may be stored on a non-transitory signal medium such as a magnetic disk, an optical disk or in a solid state memory.

The term "reconfigurable" refers to an option to configure e.g. a module in principle at any point in time to another configuration, for instance based on input, in order to achieve a certain goal, such as improved performance. Not all elements of a configuration can be reconfigured, such as the present cells are fixed. Some elements, specifically switches, connectors and bypasses can be reconfigured, i.e. forming a connection or not.

The term "non-symmetric" or "non-uniform" refers to absence of symmetry elements for a module and/or configuration as a whole, taking in account all elements claimed, such as a two-fold axis, a mirror plane, etc. The term does not exclude local symmetry elements.

The present configuration relates to one or more modules optionally being inter-connected. An example thereof is a PV-module for converting light into electricity. Typically modules have standardized sizes, e.g. in terms of cells and/or in terms of dimensions. Modules may be added to a configuration, like building-blocks, and are typically interconnected.

In order to optimize performance a key issue of the present invention is to determine one or more design templates. Embodiments of the present invention provide templates that can be adapted in order to have different real physical configurations, which allows more flexibility. The concept of the flexible/hybrid series or parallel substring connections, the placement of the local dc/dc converters, the vertical split options, and the active controlled bypass diodes can be combined in a very flexible way to increase the overall efficiency of the module. It is important to include the constraints propagated in a uni-directional way between these different options while combining them. Constraints can be compatibility of the non-uniform subset selection in previous steps.

A fully embodied template comprises all possible elements of the present invention, such as a switch between any two elements, a connector between any two elements, etc. A design template can be regarded as a subset from the fully embodied template, which design template takes into account boundary conditions, such as shadow formed by an object nearby a configuration, which shadow shifts in time and during seasons. Such boundary conditions indicate a need for a configuration being reconfigurable in order to adapt to changing situations, such as moving shadows. A design template also takes into account seasonal situations, such as snow, blanking for instance part or whole of a module. It can also accommodate (fast) temperature transients and degradation of the materials. A design template is further optimized in terms of performance of the configuration at a given point in time. It is further optimized in terms of energy-yield, measured over a time period such as at least a year, but preferably over a full expected life time of a configuration, in terms of complexity, keeping e.g. number and/or costs of components to a minimum, in view of output gained thereby, etc. As such a present design template takes into account all foreseeable situations and boundary conditions at a given point in time, as well as optional solutions thereto, e.g. in terms of components to be added and/or removed. Thus the present configuration can be reconfigured in at least two configurations matching two predetermined design templates, but typically a huge number of configurations are possible and design templates are provided. By analyzing a 3-d environment carefully a conclusion may very well be that no reconfiguration (for a certain part of a module) is to be foreseen, and as a consequence no elements would need to be added.

In order to reconfigure the present configuration real-time (or run time) a controller is provided. The controller is adapted to reconfigure one or more modules, and/or one or more groups of cells, specifically by adapting one or more of a switch, a connection, and a bypass. The present controller is adapted to optimize performance real-time in terms of one or more predetermined design templates matching a layout of the configuration; the controller can be regarded as switching from layout to layout. Optimization implies that a controller has data available as input, and further has information on the present configuration as well. Based on this information the controller may adapt the present configuration in order to e.g. optimize performance thereof. Such optimization may be performed real-time, that is in a matter of seconds or less. Optimization is in fact only limited by a time the controller needs to determine an optimal configuration and by a time needed to switch switches and/or connect/disconnect connectors and/or to activate/deactivate bypasses. Typical switching times are in the order of milliseconds up to (fractions of) seconds, typical controller times are also in the order of milliseconds up to (fractions of) seconds, typically depending on a CPU or the like used. From another point of view switching and controlling is preferably limited to some extend, as electrical components, such as dc-converters, diodes, etc. should not be loaded/unloaded too often/quickly.

Typically each module comprises an array of N by M cells, such as a rectangular array. As mentioned above modules tend to have standardized sizes. The size of the array may be characterized by integers N, M being larger than 2, N, M being interchangeable. The number of cells in an array is typically in the order of 12-120, but is not limited thereto.

Each module is capable of converting light (photons) into electrical current/voltage, which current/voltage is typically converted by a transformer/converter, e.g. from DC to AC, in order to have a current and voltage available for use.

Each module comprises at least one first group of cells connected in series and/or at least one second group of cells connected in parallel. As such cells in a module are connected to one and another, in parallel or in series, or both. Not all cells of a module need to be connected. In fact, the present configuration may contain at any point in time a certain number of cells not being connected for one or more of various reasons, such as malfunction, dysfunction, external shadow covering one or more cells, pollution, such as birds' excretion, etc. Typically an optimal configuration relates to a combination of cells connected in series as well as cells connected in parallel. The number of cells in the first and/or second group may vary due to e.g. boundary conditions. In fact any group of cells may comprise any number of cells, the number being smaller or equal to the number of an array (n*m). It is observed that not all groups may have a number of cells equal to that of an array, as such a configuration is symmetrical.

Each module comprises at least one third group of cells comprising one or more DC-converters. For converting current/voltage from DC to e.g. AC at least one converter is provided.

An advantage of embodiments of the present invention is that the fabrication cost can be significantly reduced by introducing strong non-uniformity into the topology. For example, the non-uniformity applies to wires and switches and also DC-converters and bypass diodes. Groups of cells can be formed by parallel or series connections of the substrings using switches and wires positioned at strategic places which still allow improvement or even maximization of the energy-yield. Connections are removed from the design for which the expected life-time gain is insufficiently high in view of the additional cost of the required overhead components. Each module preferably has local DC/DC conversion and the number of converters is preferably linked with the number of substrings of the module but still limited to reduce the overhead. Which converters are in use for a given run-time situation depends on the groups of substrings which have been formed. Finally, the local converters can preferably be connected either in parallel or series according to the power demand of the system from the module.

DESCRIPTION OF LINES USED

Figure 1:
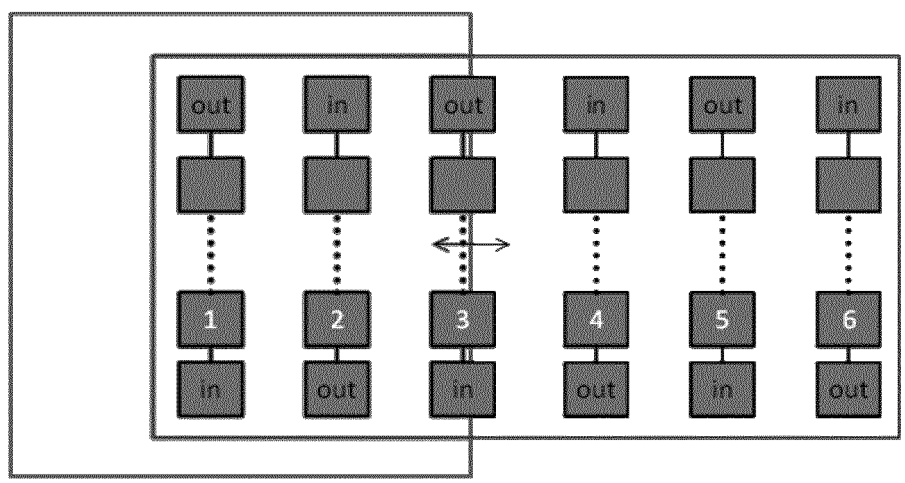
FIGS. 1 and 2 show a horizontal and vertical PV arrangement, respectively with a shadow of a cloud.

—— Continuous thin line: small distance series connection

········ Dotted thin line: small distance parallel connection

— — — Long-dashed thin line: long distance series connection

·—··— Long-dash dot dot thin line: long distance parallel connection

----- Dashed thin lines: substrings-converter connections

··—·· Long-dash dot thin lines: intra-converter connections

········ Dotted thick lines: show of continuity

Continuity means that there is a repetition of the relevant elements but that these are not shown individually.

In the drawings light grey boxes are PV cells of substrings of the modules, whereas dark grey boxes are local DC/DC converters.

DETAILED DESCRIPTION OF PREFERRED EMBODIMENTS

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The present invention relates to PV modules and installations, to methods of designing and constructing such PV modules, whereby the PV modules are reconfigurable at run-time.

In an example of the present configuration switches are adapted to devise, connect and reconnect modules and/or substrings, one or more connectors for connecting modules and/or substrings.

Switches can be configured between DC-DC converter and substring and between the substrings in different combinations like series, parallel, symmetric and asymmetric.

Each switch has a state, such as "on" or "off", i.e. connected or disconnected. States of the switches are controlled such as by a knob-controller depending on the phase and the current imbalance in each substring.

As connections of the converters can be controlled at the run time, the present configuration can be reconfigured real time, i.e. instantly, adapting for instance to a changing situation. For instance, when a substring is partially shaded or any imbalance in a current appears then the substring is connected with its own DC-DC converter via a switch and it is isolated from all other substrings.

So a mismatch effect can be avoided. A disadvantage is that a current generated may be less. An advantage is that the current from that substring will be added to the total current of the module which helps to improve overall efficiency.

In case of damage, the substring can be completely isolated from the module.

If two or more substrings are in same phase then they are in an example in series configuration via the switches and connected to a single converter, as such will improve performance of the system.

Imbalance of a current and overhead of the circuitry can be compared at the run time by the controller. Depending on both factors mentioned, the controller will determine whether a photon generated current in a substring or group of them, can be added to a total current or not. For active bypass diodes the control granularity is different and can be up to neighboring cells.

Figure 38:
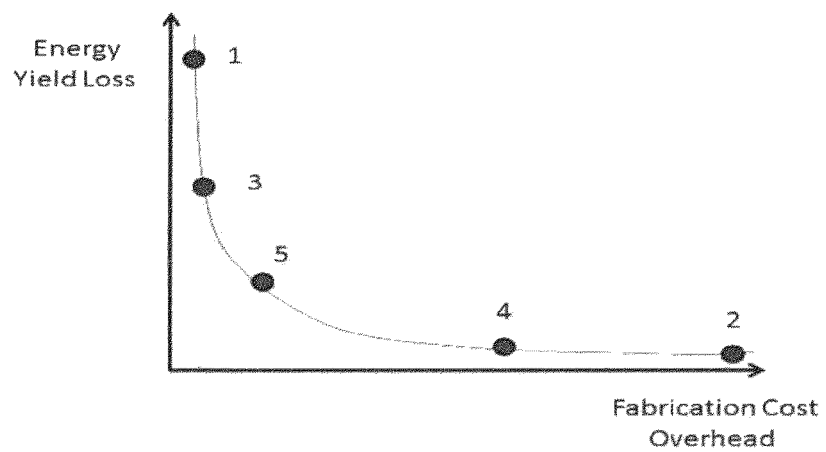
FIG. 38 shows a typical optimisation curve of a trade-off between antagonistic parameters, e.g. in the form of a Pareto optimisation.

Advantages of embodiments of the present invention are the attractive trade-off point between fabrication cost and the increased energy yield, and these can be used for evaluation of actual PV modules and an installed PV system. An aim is to increase the annual energy yield while the fabrication cost overhead remains sufficiently low. Optimization of all cost aspects simultaneously is not possible. It is evident that by pursuing optimization of one cost aspect, the other tends to worsen. One can seek trade-offs rather than optimizations. In order to illustrate this behavior, FIG. 38 shows the results for several configurations. The two axes of the graph represent the fabrication cost overhead and the energy yield loss. The purpose is to track the Pareto point which is the optimum choice. Commercial modules have low fabrication cost but have high energy loss (Point 1). The potential connection of all neighboring cells has low energy loss but translates to a high fabrication cost (Point 2). Point 3 can be the localization of the DC/DC conversion with no dynamic reconfiguration of the module and Point 4 the decrease of the potential connections of the cells within the module. Point 5 is an intermediate Pareto Point of the curve. Configurations according to embodiments of the present invention, can be designed to lie at different positions on the Pareto curve, e.g. by changing the number of DC/DC converters, the number of vertical splits and the number of bypass diodes. In this way in principle the range between point 3 and 4 can be covered.

Terminology

Substring: permanently interconnected cells which are treated as a non-divisible unit.

Parameterized topology: a topology which includes all possible wires and additional components (especially switches) which are within the optimal Pareto trade-off boundaries for the given context where the topology is designed for. In embodiments of the present invention, a significant and non-uniformly located set of wires and other components is absent compared to the arrangement where all possible configurations can be activated. This restricted interconnection and configuration of the topology is preferably Pareto optimal because this will significantly reduce the additional production cost, energy overhead and negative life time effects. Moreover the overall achievable energy-yield is still close to what ideally can be reached because the existing wires and components yield sufficiently good results (based on a general cost function) under all potential scenarios that are present in the predefined context. A parameterized topology can also be projected into a large number of design instantiations, by incorporating constrained characteristics of specific situation (see design instantiation definition). In that sense the topology can also be seen as the union of all possible design instantiations that would possibly be required in that context.

Hybrid: an arrangement of groupings of series and parallel connections of substrings. Hybrids can include combinations of substrings connected in series and/or parallel in a hierarchical manner, i.e. in one or more layers or more than two layers which are connected together. Switches can be located between layers such that the number of combinations of the substrings is less than all possible such combinations. Hybrids arrangement can include groupings of series and parallel connections of substrings.

Design Instantiation: a design instantiation (i.e. a design intended to be a physical working implementation of a PV module) allows several run time configurations of the PV module. The components that are absent in a design instantiation are not only those which are removed based on a general cost function (e.g. out of Pareto boundaries). A design instantiation is a choice of a Pareto point which takes into consideration trade-offs between several cost aspects that depend on the active situation imposed by the expected boundary conditions on the type of locations where the instantiation is intended to be used (e.g. partial shading or local degradation of a specific nature). Examples include vertical building walls, roof panels positioned in climates with mostly strongly changing cloud shadings, or climates that have a relatively low ambient temperature, or strong winds affecting the air convection.

Run-Time Instantiation: a configuration of the physical working implementation of a PV module in a specific moment of time. All switches are fixed in a given position, and it is typically used for a preselected scenario.

Run-Time Situation (RTS): situation of use of the PV module for a photonic stimulus such as a given irradiation input (including any shading), degradation effects, temperature profile and air movement.

System Scenario: clustering of RTSes that exhibit similar behaviour toward the way the PV module reacts to these situations. See V. Gheorghita e.a., ACM Trans. On Design Automation for Embedded Systems, January 2009.

Parallel direction: a PV module is assumed to be installed such that a shadow or a cloud is moving on the parallel direction of the module, if the edge of the shadow is parallel to the substrings (See FIG. 1—the cloud shadow is represented by the box partially covering the arrangement).

Figure 2:
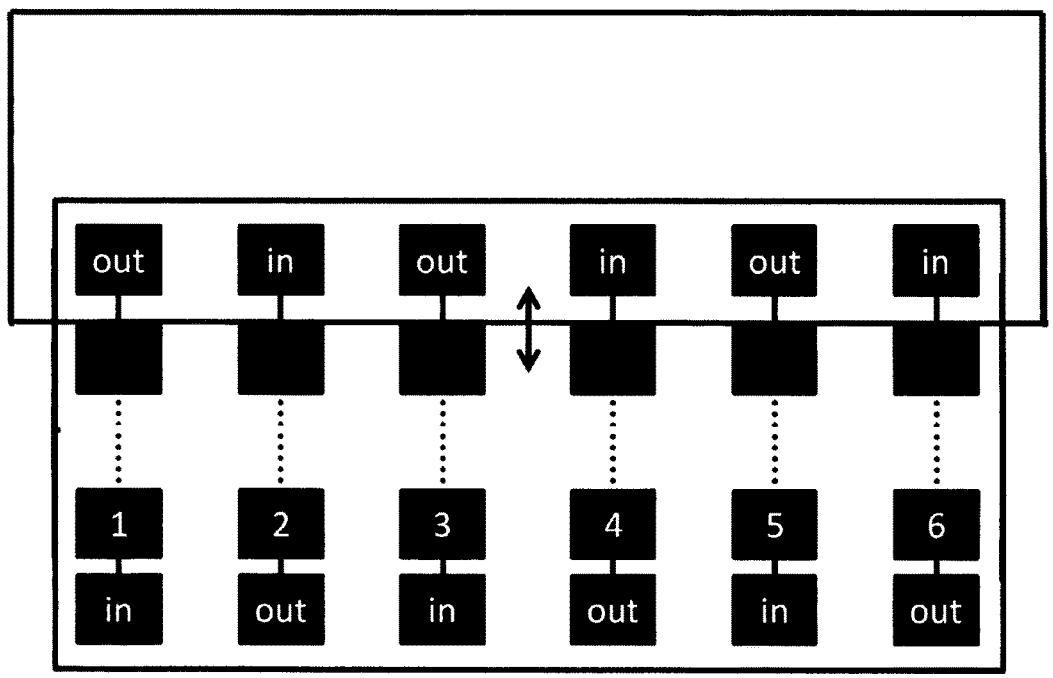

Vertical direction: a PV module is assumed to be installed such that a shadow or a cloud is moving on the vertical direction of the module, if the edge of the shadow is orthogonal to the substrings (see FIG. 2).

"Top" and "Bottom": the term top or bottom as applied to PV arrangement refers in first instance to the top and the bottom of the drawings. It also can have a significance in any of the embodiments of the invention as PV modules are often arranged at a sloping angle. For such an arrangement there is a top and bottom which is the same as the use of top and bottom as used in the present invention. In such a case bottom is preferably a default location of most of the DC/DC converters. "Top" is usually without DC/DC converters or only a limited amount of them.

Figure 3:
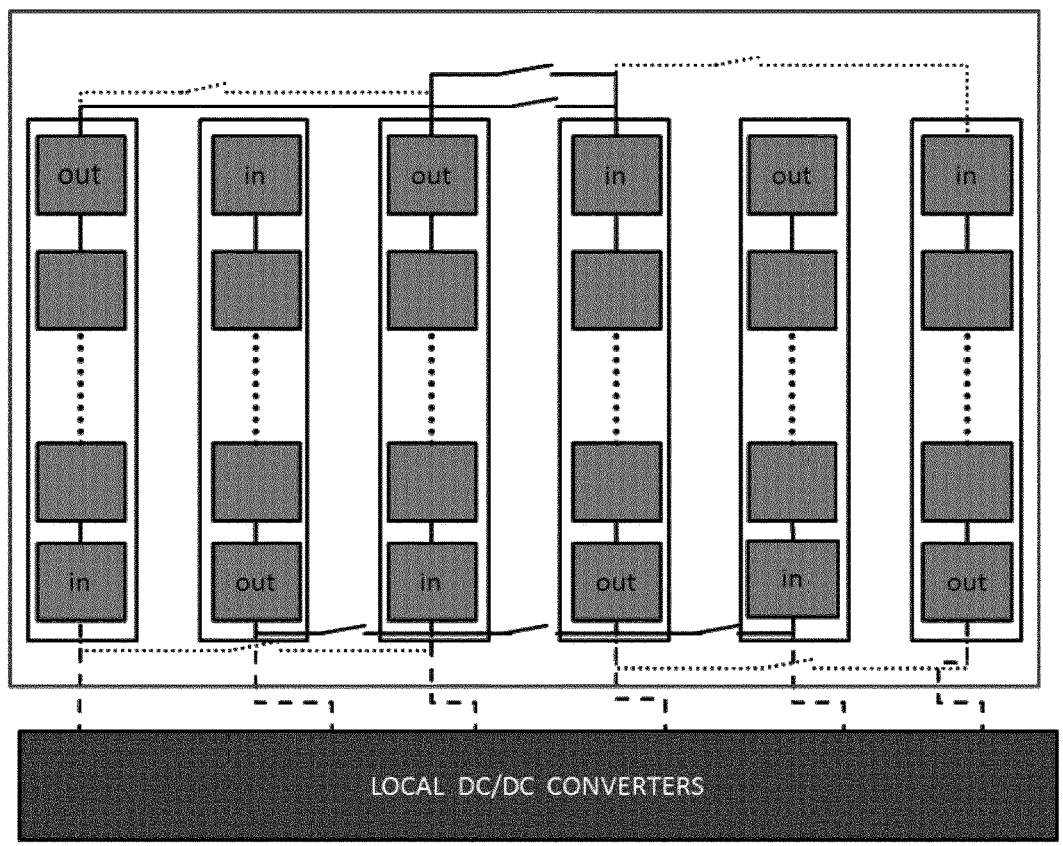
FIG. 3 shows a PV arrangement with cells in rows and columns.

A PV module can be an N×M mesh or array of PV cells with N and M being integers. N and/or M are greater than 2. The mesh or array will usually be arranged in rows and columns (see FIG. 3). However the present invention also includes meshes that are hexagonal or triangular in form.

Selection of Substrings

The purpose of dividing the module to substrings is to have a run-time variable (called "knob-controlled") series/parallel or hybrid connection that allows the grouping of substrings which function under similar conditions in order to avoid mismatch effects that reduce energy-yield or to improve the module life time (component reliability impact). Each group of substrings is connected to a local dc/dc converter where the duty cycle, and thus the voltage, is preferably set to the near-optimal value for the specific group of substrings.

Figure 4:
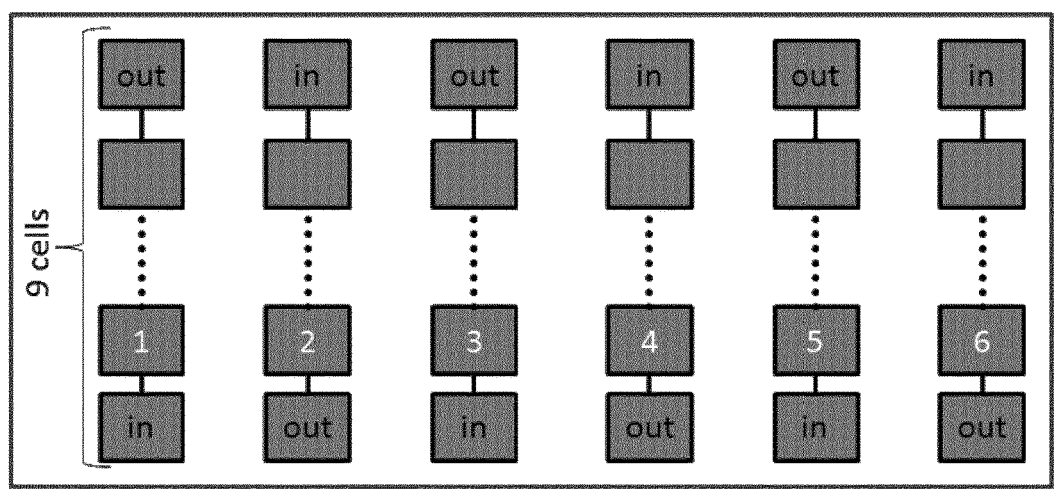
FIGS. 4 and 5 show a PV module of 6 by 9 with 6 substrings of 9 cells length and a module of 6 by 9 with 9 substrings of 6 cells length respectively.
Figure 5:
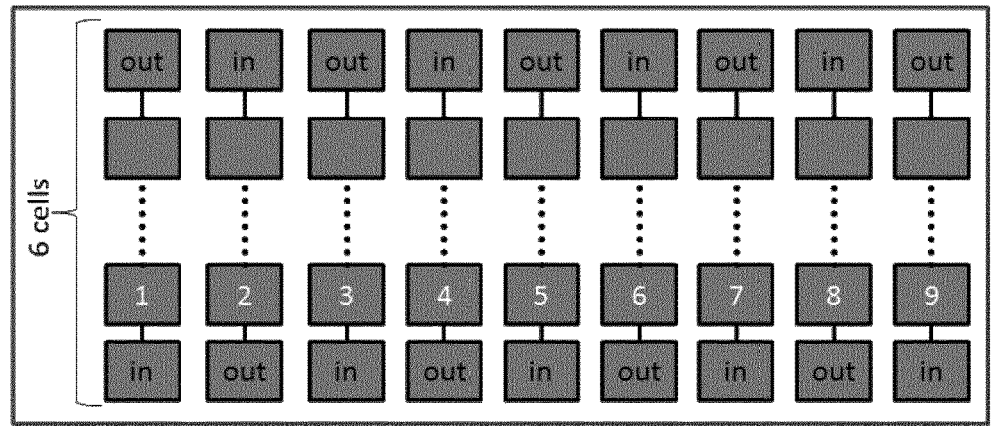

A substring preferably includes as few cells as possible in order to allow more flexibility to the module. The selection of the substrings preferably takes into account the length of the wires required for their interconnection and their intra-connection. It is evident that adding run-time variable ("knob-controlled") connections at the edges of the module is less costly than changing the electrical connections within the inner part of the module. The columns or the rows of the module are the best options to be used as substrings for the N*M mesh-shaped modules which are being targeted. Based on the above, the selection is preferably according to the length (in number of cells) of the columns and rows of the module. Another criterion can be whether the number of rows and columns are odd or even. An even number of substrings is more optimal, as in the all series connection of the module the inputs and the outputs are on the same side of the module and are more easily connected to the converters. In the case of an N by M module where N<M and M is even, a preferred e.g. optimal choice is to have M substrings of N cells. If M is an odd number, a trade-off exists in terms of having small substrings or an even number of substrings. The case where both N and M are odd numbers is considered less preferred, though in that case the smaller dimension would be formed into substrings. For example, a module of 6 by 9 cells can have either 6 substrings of 9 cells choosing to have an even number of substrings either 9 substrings of 6 cells in order to have a smaller length of substrings. Two options of forming the substrings in a simple structure are illustrated in FIGS. 4 and 5.

Embodiments of the present invention include different ways of dividing the module into substrings, e.g. in a "Vertical split", which provides another approach of handling the trade-off described above relating to even number of substrings-small substrings. More complex structures can include hybrids.

Figure 6:
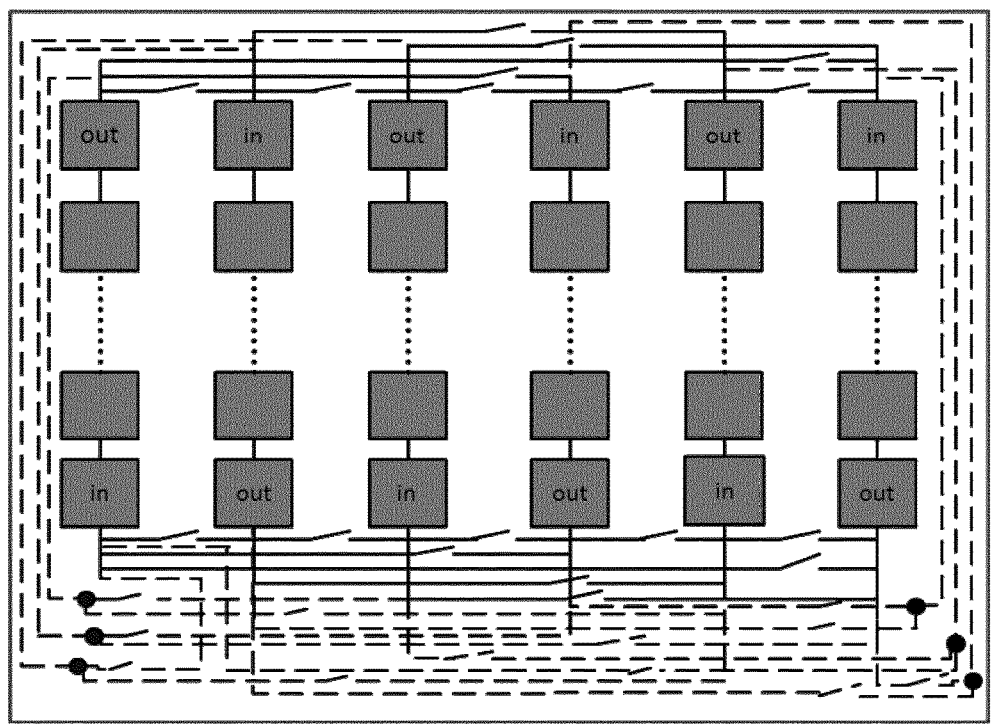
FIGS. 6 and 7 show a PV module having all series and all parallel connections of the substrings, respectively.

Series and Parallel Substring Connections in the Module
  a. Series Connections of the Substrings A PV module that will be mostly used as illustrative basis in embodiments of the present invention comprises 6 columns of 9 cells. All the cells in a column are permanently connected in series and form a substring. Each substring allows a specific direction of current flow. In this way, the amount of extra wires that have to be added can be kept low or minimal. That is especially so for the wire overhead required under optimum illumination conditions where all the substrings are connected in series. In the figures the current flow is indicated by "out" and "in" on the ends of the substring. In FIG. 6, all possible series connections of the substrings are shown. In the series connection, an "out" pin can be directly connected to an "in" pin and vice versa. The continuous lines in FIG. 6 indicate wire connections which remain on the same side of the module, while the long-dashed wires connect an "in" pin with an "out" pin on different sides of the module. In the series connection, the current remains identical for all cells while the voltage adds up with each additional cell.

b. Parallel Connections of the Substrings.

Figure 7:
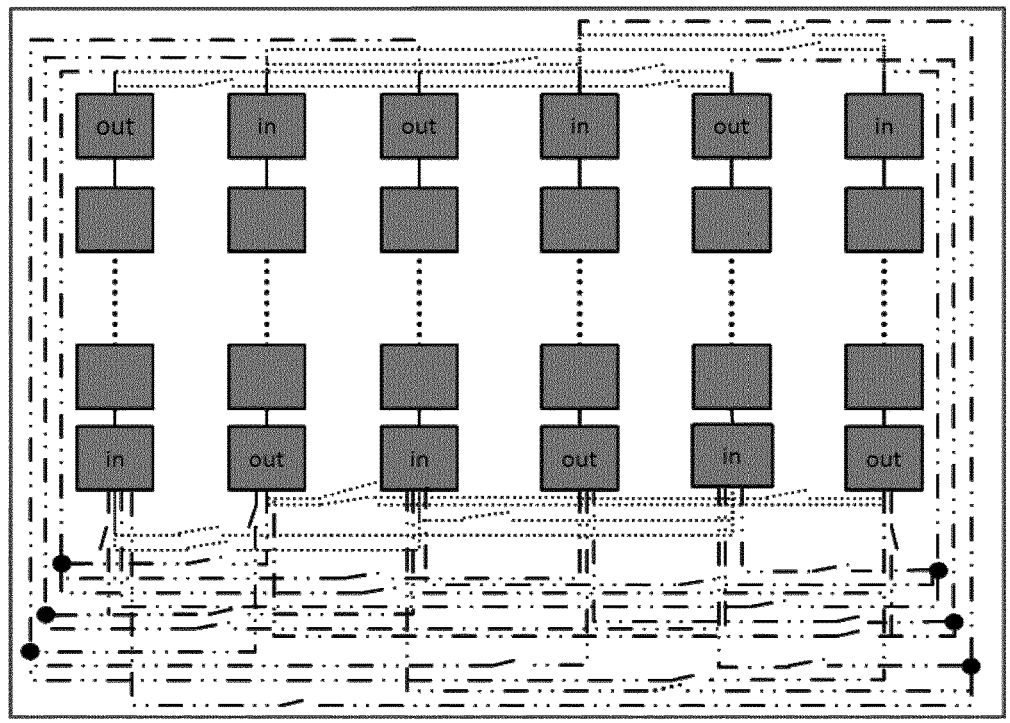

All parallel connections of the substrings is shown in FIG. 7. If all connections of the substrings were available, the wires on both figures (all parallel and all series connections) should be superimposed which leads to a too large amount of wires.

In order to allow connections in parallel, an "in" pin should be connected with another "in" pin and the two "out" pins of the same two substrings must be connected as well. This means that in order to allow all possible parallel connections, all "in" pins should be connected to one another and all "out" pins with one another. In FIG. 7, all possible parallel connections are shown. Dotted thin lines are used for connections along the same side of the module, while long-dash-dot-dot lines connect pins from different sides of the module. In the parallel connection, the current adds up while the voltage remains the same over all substrings.

c. Pruning of the Wires
  i. Series Connections

If all possible series and parallel connections are taken into account, the overhead caused by all the extra wires will lead to a decrease of the overall efficiency. In accordance with embodiments of the present invention, the connections which are possible should be limited by removing, in one or more ways that will be described below, long wires which impose too much overhead compared to their expected gain, and optionally removing connections which are less needed because they can be replaced by others that provide nearly the same overall gain. Moreover, when they are not needed in order to enable an improvement of the energy yield or life time, then the switches and other added components can, as much as possible, be "hidden" from the dominant active paths in the topology. The dominant active paths are the series connections or other often used paths as determined at the design stage used in most occurring practical scenarios. In conventional approaches, these added components do contribute continuously to the dominant active paths and hence cause a near-permanent overhead in power and reliability losses. Embodiments of the present invention allow avoidance of this problem by the choice of run-time variable ("knob-controlled") topology.

Note that cost and gain should be seen here in a 3-dimensional objective space of restricted production and maintenance cost, increased yearly energy yield, and increased life time. Providing one or more of these three characteristics of a PV module are advantages of embodiments of the present invention.

Figure 8:
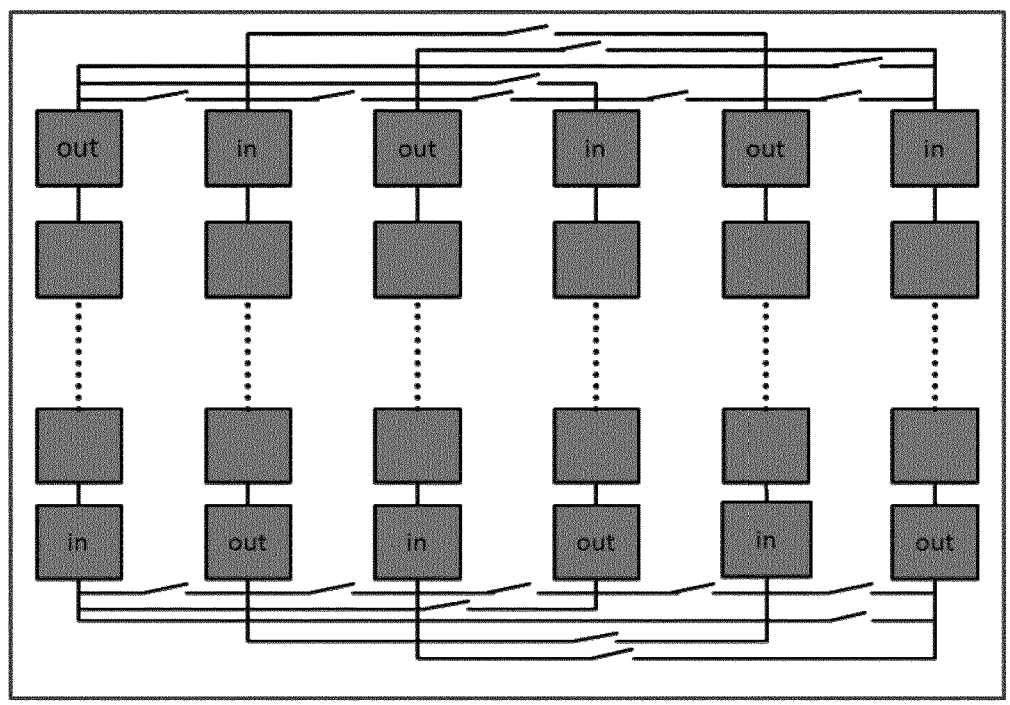
FIG. 8 shows a PV module of an embodiment of the present invention with removal of crossing wires in series connections (9 by 6 case) to form a non-uniform module.

Embodiments of the present invention reduce the overhead, which is introduced by the presence of wires, by removing (i.e. not having or using) the longest wires. In series connection, the wires which are "crossing" the module, the long-dashed wires, are removed (see embodiment of FIG. 8 compared to FIG. 6).

In order to keep wires at the same side of the module (resulting in a non-uniform or non-symmetric module as the wires are mainly on one side), the PV module is adapted so that all substrings are connected only with substrings which allow opposite current flow. In a module of 6×9, where each column is a substring, each substring is connected on each side of the module with 3 substrings. The remaining wires are still quite long, especially if the general case of N by M cells is considered. In that case, in embodiments of the present invention that are non-symmetric or non-uniform, even more pruning is carried out, e.g. removal of all wires that extend beyond a user-defined threshold length. That threshold length can be selected by a computation based on an analysis of which wire length overhead cannot increase the energy-yield with a sufficient gain. Thus the threshold can be determined by using a cost function that combines the energy-yield and the cost gain for example. This will be illustrated below in more detail.

Figure 9:
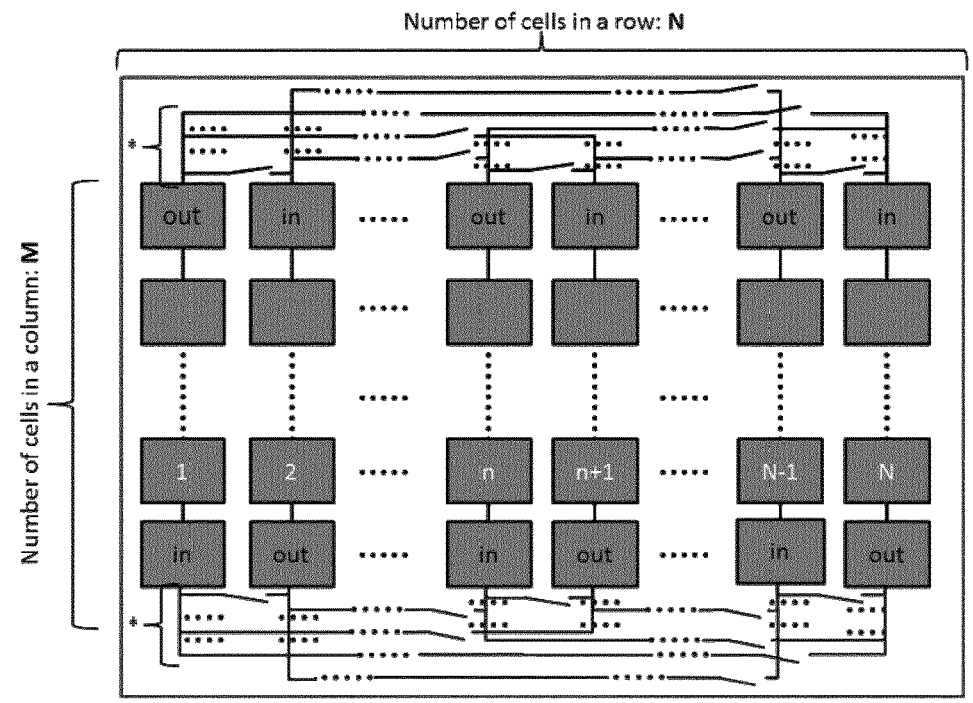
FIG. 9 shows a PV module of an embodiment of the present invention with removal of series crossing wires to form a non-uniform module.

In the embodiment shown in FIG. 9 that is non-symmetric or non-uniform, each substring, which in this case means each column, is connected with all the substrings of opposite current flow on the same side of the module. So each substring has connections with N/2 substrings on each side of the module, as shown in the embodiment of FIG. 9. This does not mean that every substring is connected with all N−1 substrings. Every substring is connected with N/2 substrings twice, once at the top of the module and again at the bottom of the module. If the substrings are enumerated, beginning from the substring which is situated on the left, then substring 1 is connected with substrings 2, 4, 6 . . . (with all even substrings). Any odd substring is potentially connected with all even substrings and any even substring is potentially connected with all odd substrings.

Figure 10:
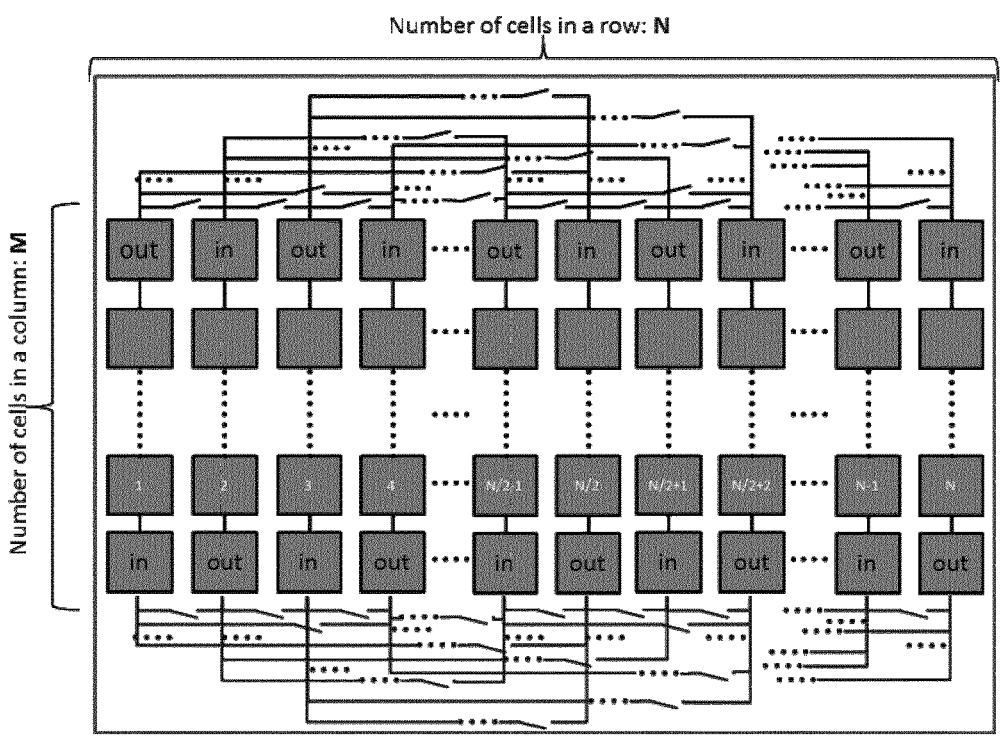
FIG. 10 shows that if a substring in a PV module is closer to the edge of the module, the connections are reduced, in accordance with embodiments of the present invention.

Although all wires that are crossing the module have been removed, the remaining wires may still be quite long, (the length of the longest wire is equal to the length of the entire module, N−1 cells long). In order to further reduce the amount of wires, embodiments of the present invention assign a maximum length that has to be respected. As an illustration, the proposed upper bound for the maximum length can be selected as N/2. If x is set as the maximum length and x is an odd number of cells, the longest wires connecting substring number y will be with substrings number y−x and y+x, where y−x and y+x must be between 1 and N. If x is an even number of cells, then the longest wires will connect substring number y with substrings number y−x+1 and y+x−1, where again y−x+1 must be between 1 and N. Assuming that substring y is situated such that both y−x {y−x+1} and y+x {y+x−1} are within 1 and N, substring number y can be potentially connected with x+1 {x} substrings. If the substring is closer to the edge of the module, the connections are reduced, as shown in the embodiment of FIG. 10.

Figure 11:
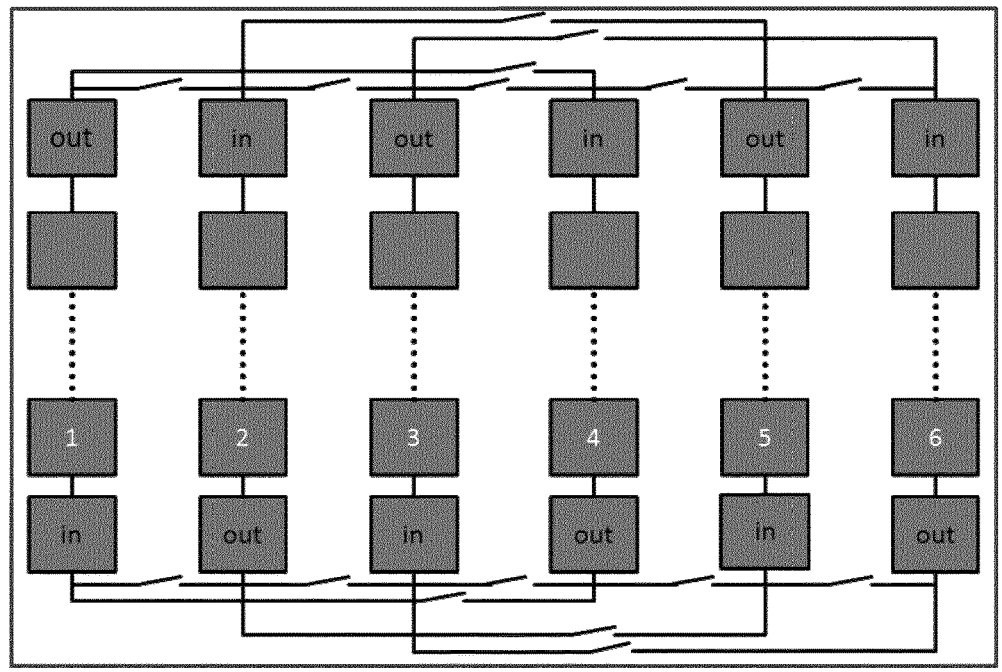
FIG. 11 shows a PV module having removal of wires in the series connections according to the maximum length (6 by 9 case) in accordance with embodiments of the present invention.

In embodiments of the present invention wires are removed according to maximum length criteria in the general case. For a module of 6 by 9 cells, and a maximum length set to 3 cells, substrings 1 and 6 are connected in series with two substrings on each side of the module, whereby substrings 2, 3, 4 and 5 are connected to three others. This is illustrated in the embodiment of FIG. 11.

ii. Parallel Connections

Figure 12:
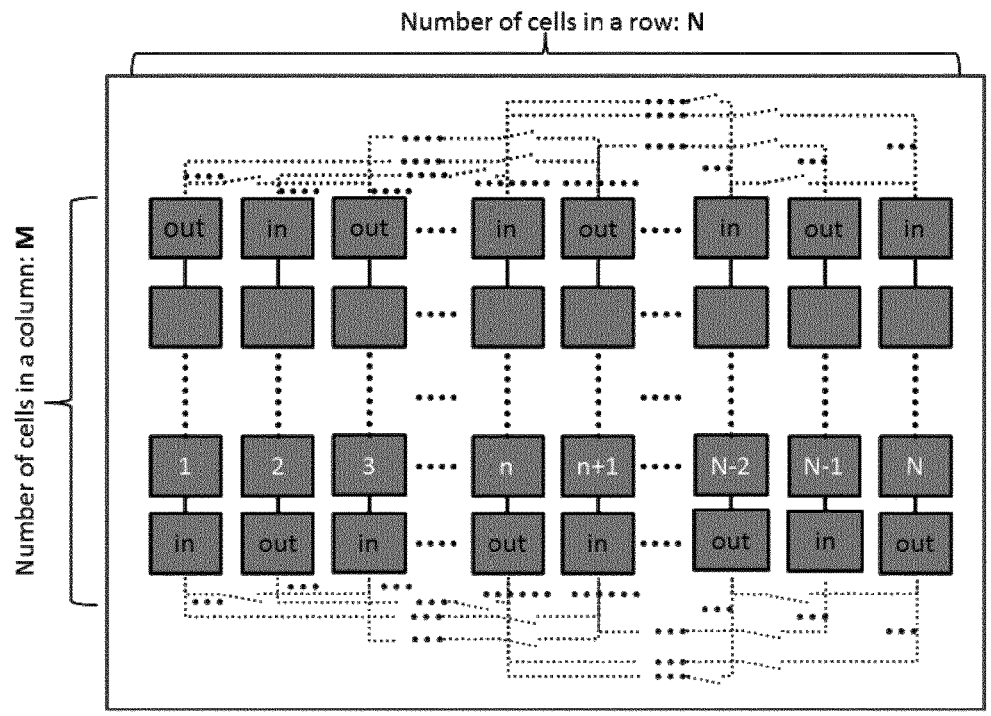
FIG. 12 shows a PV module having parallel wires with maximum length applied in accordance with embodiments of the present invention.
Figure 13:
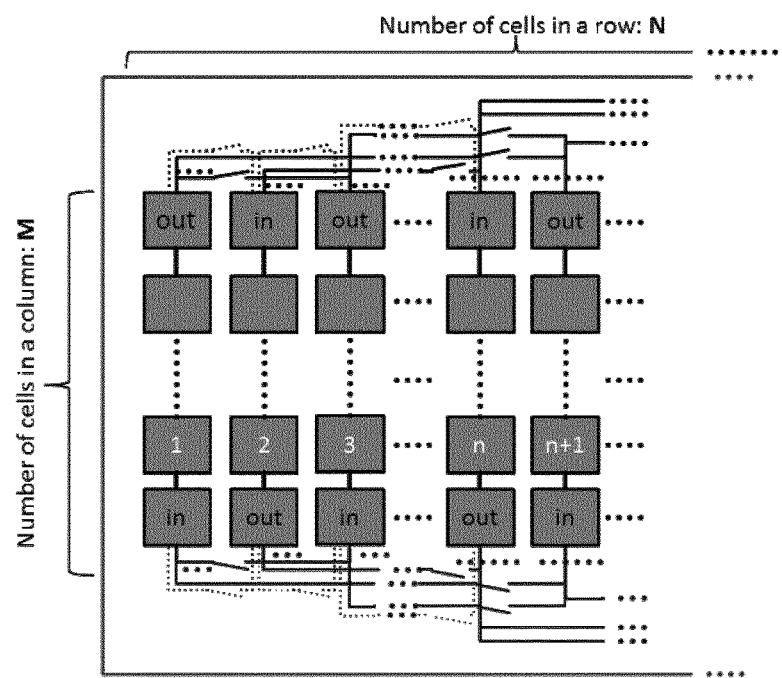
FIG. 13 shows that for a PV module it is not necessary to apply the same maximum length for the parallel and the series wires and these can differ due to the not identical overhead calculation in accordance with embodiments of the present invention.

A section of a module where all possible parallel wires are present is shown in the embodiment of FIG. 12. For parallel wires, the same reductions in wires can be carried out all of which are embodiments of the present invention. It is not necessary to apply the same maximum length for the parallel and the series wires and it can differ due to the not identical overhead calculation (see the embodiment of FIG. 13).

d. Hybrid Connections and Examples. Why it Takes into Account all Plausible Irradiation Scenarios.

In previous embodiments, the series and parallel connections refer to the interconnection of the substrings. Although the two types of connections are described separately, wires from both types of connections are active in a run-time instantiation of the module and in the parameterized topology of the module according to embodiments of the present invention all wires are present. The combination of active wires in each run-time instantiation can determine the number of DC/DC converters which are needed and the substrings which should be connected to local DC/DC converters, but does not affect the decision of the connections between the converters. The smallest number of cells which can be treated independently is the cells which form a substring. It is understood that in preferred embodiments of the present invention, the PV module is flexible (i.e. can be reconfigured) mainly in the horizontal direction, which is why the selection of the substrings is based on the dimensions of the module. The irradiation differences which are taken into account are caused mainly by the movement of clouds. Static obstacles which are present are not considered as these are known a priori (and hence can be allowed for in the design by other means) and different kinds of optimizations can be made. Each cloud can shade part of the module and this shading is moving in one direction. A superimposition of the shading of several clouds can lead to a variety of movements of the shading of the module, but a checkerboard irradiation scenario of the module is considered very unlikely i.e. will not be considered. As the electrical degradation of a cell, e.g. by aging, normally affects the operation of the electrically neighboring cells, a checkerboard scenario is also highly unlikely for degradation effects as well. At each run-time situation, each substring can potentially produce a certain power which is the maximum under the specific operating conditions. The voltage and the current which are produced for that power are used to check the compatibility of each substring with other substrings. If some cells within a substring lower notably the potential maximum power produced by the substring (e.g. mismatch effects in a series connection of the cells cause the current to take the value of the current produced by the "worst" cell involved in the connection), actively controlled bypass diodes can be placed in order to avoid such a power loss.

These bypass diodes will be further analyzed later in other embodiments. According to the current and the voltage that characterizes each substring, design decisions are made about their interconnections. The goal is to connect in series substrings for which their current is similar and to connect in parallel substrings which have similar voltage values. It is possible to have similar current and voltage simultaneously in which case the decision of the connections is affected by the length of the wires required and also the current and voltage demand. So, in embodiments of the present invention, the flexibility of the module provided by the run-time variable ("knob-controlled") series and parallel connections of the substrings combined with the potential placement of bypass diodes covers nearly all possible run-time situations.

Distributed DC-DC Converters a. Connection of the Substrings with the Converters In some embodiments of the present invention, the maximum number of dc/dc converters is in principle the number of substrings in the module. It is however not very efficient to have a single substring connected to a converter. In the module which was considered as illustration (6×9) the input and output of each substring are on opposite sides of the module, so the connection with a dc/dc converter would involve a long wire crossing the module vertically. The input and the output of a "group", where now the possible groups are reduced as some wires have been removed, will be on different sides of the module if the group has an odd number of substrings. In the best-case scenario where the whole module is operating under similar illumination conditions, all substrings should be connected in series. In order to avoid having long wires to the converters, the module is considered to have an even amount of substrings.

For that purpose, in embodiments of the present invention, the maximum number of local dc/dc converters that are available for one module is reduced to half the number of the substrings of the module and the local converters are situated on one side of the module thus resulting in a non-symmetric or non-uniform module. In the case of an N by M module, where each column is a substring, maximally N/2 dc/dc converters are present. Not all converters are necessarily in use in a specific run-time instantiation. The interconnection of the converters can be determined by the position of switches. The connection can be in series, in parallel or even hybrid. As a converter is not used for every substring, a single substring is not possible to be isolated in the case of an even total number of substrings. If a substring is needed to be isolated from any connection, it is necessary to remove one more substring, which is considered an acceptable penalty given the even larger cost of adding the long wires and switches needed to enable a more flexible isolation.

Figure 14:
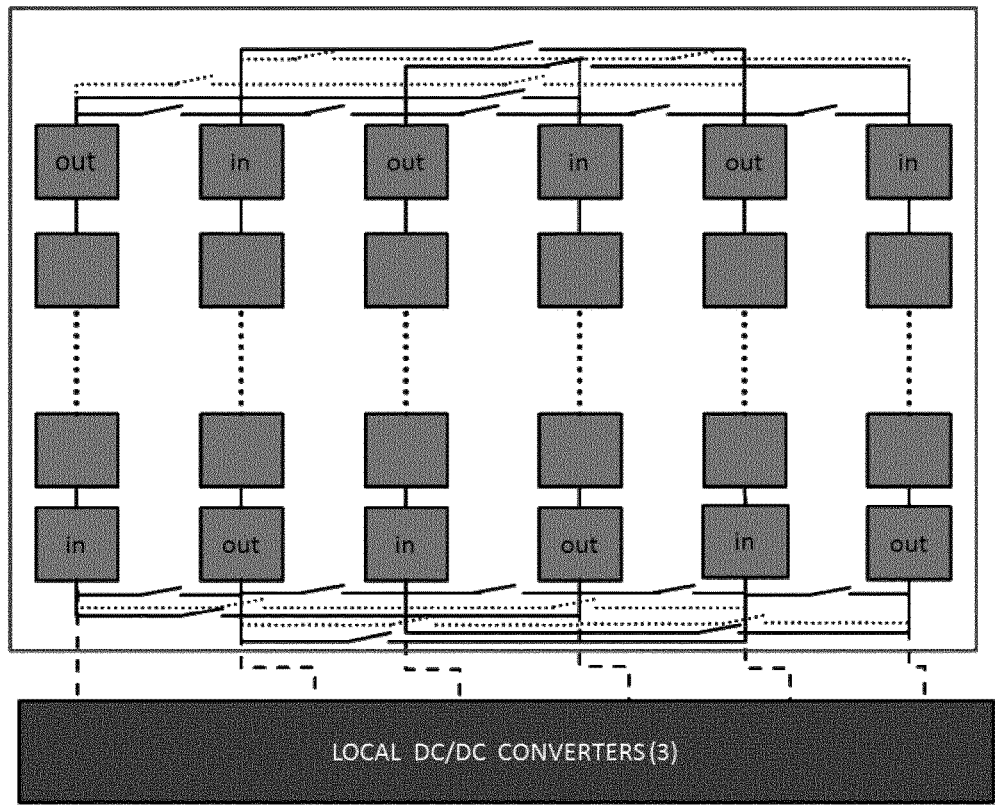
FIG. 14 shows that for a PV module in accordance with embodiments of the present invention the converters can be located at the bottom of the module and all in and out pins of the substrings at the bottom side of the module can be potentially connected with the converters.

Series and parallel connections of the substrings of this embodiment are shown in FIG. 14. The converters are located at the bottom of the module and all in and out pins of the substrings at the bottom side of the module are potentially connected with the converters. The dotted lines which connect the substrings with the converters in the figure are switch-controlled.

In the embodiment of FIG. 14, the connection with the converters is shown in the case of a 6×9 module, where all the long wires have been removed (only series connections). As the converters are just on one side of the module (hence being non-uniform or non-symmetric), it is known a priori that all groups will have the input and the output at that side of the module. In the embodiment of FIG. 14, the converters are located at the bottom side of the module resulting in a non-symmetric or non-uniform module. The bottom and the top side of the module have exactly the same connections between the substrings. Substring 3 is connected with substring 4 both at the bottom and at the top of the module. These two connections are not equivalent as they allow different groups where the in and out will be both at the bottom of the module. For example, if substrings 1, 2, 3 and 4 are needed in the same group, substrings 3 and 4 will be connected at the top side. In the case where substrings 2, 3, 4 and 5 belong in the same group, substrings 3 and 4 will be connected in the bottom side of the module (the order of the substrings, beginning from an "in" pin is: 5, 4, 3, 2). The fact though that the converters are situated on one side of the module, which leads to an asymmetric topology, indicates that the symmetry of the wires can be unnecessary. As all inputs and outputs should be in the bottom of the module, it means that only intermediate connections of the groups are at the bottom side of the module. If a group consists of two substrings, the connection between them is at the top side of the module. In the case of a group of four substrings, two connections are located at the top side and one at the bottom side.

As mentioned above, in the series connection, wires at the bottom side are used only in the case where a group of at least four substrings is present. As the number of converters allows all pairs of substrings to be connected with a local converter, some wires from the side of the converters can be removed. Most run-time instantiations will still be realizable in the same way as before, while others will require the use of more converters.

Figure 15:
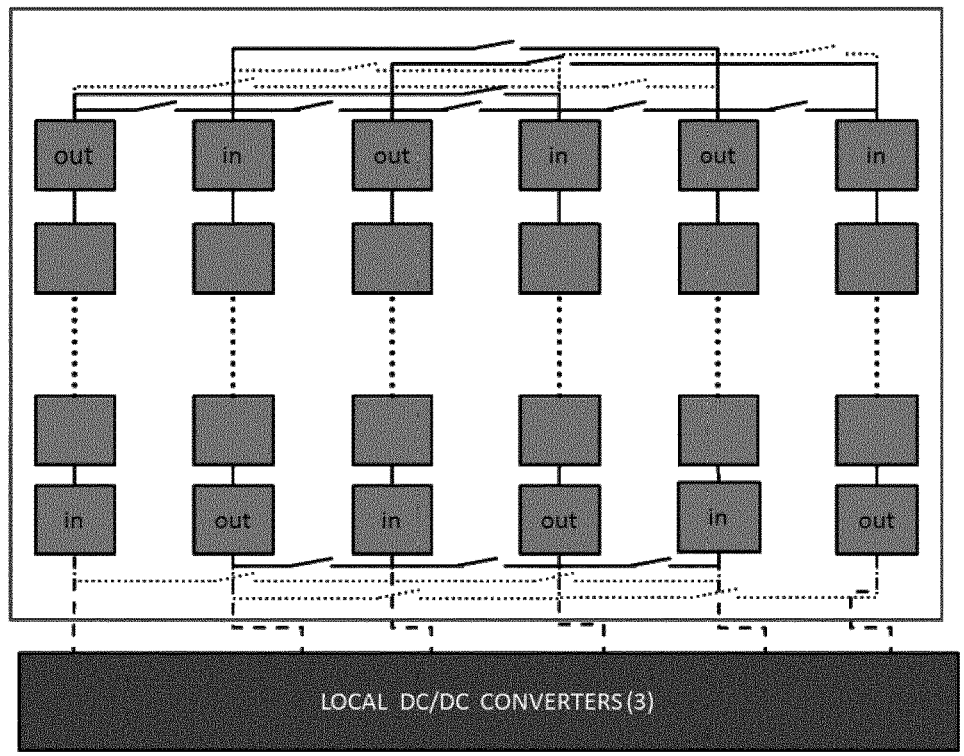
FIG. 15 shows a PV module having some wires from the side of the converters having been removed resulting in a non-symmetric or non-uniform module in accordance with embodiments of the present invention.

In the embodiment of FIG. 15, some wires from the side of the converters have been removed resulting in a non-symmetric or non-uniform module. Substrings 2, 3, 5 and 6 can form a group with an ordering of the series connection from an "in" pin to an "out" pin: 3, 2, 5, 6 but a long wire is needed between substrings 2 and 5 at the bottom side of the module. This group would be connected to a single converter. In contrast, in the embodiment of FIG. 15 this is not possible. Instead substrings 2 and 3 can be connected in series then and they use one converter, while substrings 5 and 6 use another converter.

The case of embodiments having a parallel connection of substrings is different. In order to connect two substrings in parallel, a pair of wires is necessary, one to connect the outputs and one to connect the inputs of the substrings or the set of substrings. It is reasonable to expect that the wires at the bottom and the top of the module will be identical, especially if it is assumed that a parallel connection is used to connect single substrings. The additional cost of all the wires for enabling parallel connections of the substrings is quite large even with the criterion of maximum length applied. Two main factors contribute to the rule against the formation of a group which consists of two single substrings connected in parallel.

Low voltage: A single substring, in a normal size module, produces a small output voltage. In a parallel connection of two substrings, the voltage remains the same and the current is added up and it will usually be inefficient to connect such a low voltage with a local dc/dc converter.

Input and Output Pins: The input and output pins of the parallel connection of two substrings will be on different sides of the module. As the local dc/dc converters are situated on one side of the module, the connection would require the presence of long wires crossing the module.

Figure 16:
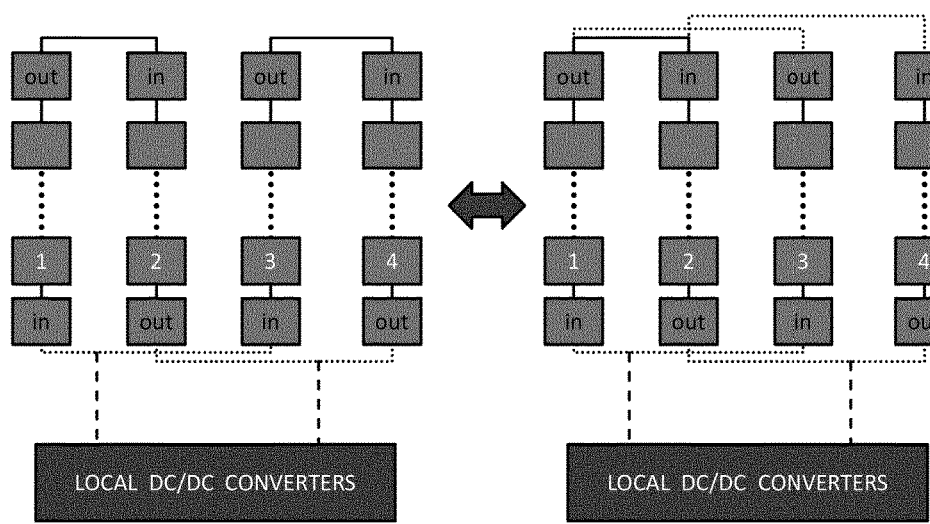
FIG. 16 shows a PV module having substrings 1 and 3 as well as substrings 2 and 4 being connected in parallel and then 1//3 being connected in series with 2//4 module in accordance with embodiments of the present invention.

In the case where four substrings operate under similar conditions and the voltage demand is not so high, it is not optimal to have a series connection of all four substrings. Substrings 1 and 3 as well as substrings 2 and 4 can be connected in parallel and then 1//3 can be connected in series with 2//4 ({1//3}&{2//4}). This connection is equivalent though with connecting the substrings first in series and then in parallel ({1 &2}//{3&4}). The second configuration has the advantage of using less wires as shown in the embodiment of FIG. 16.

Figure 17:
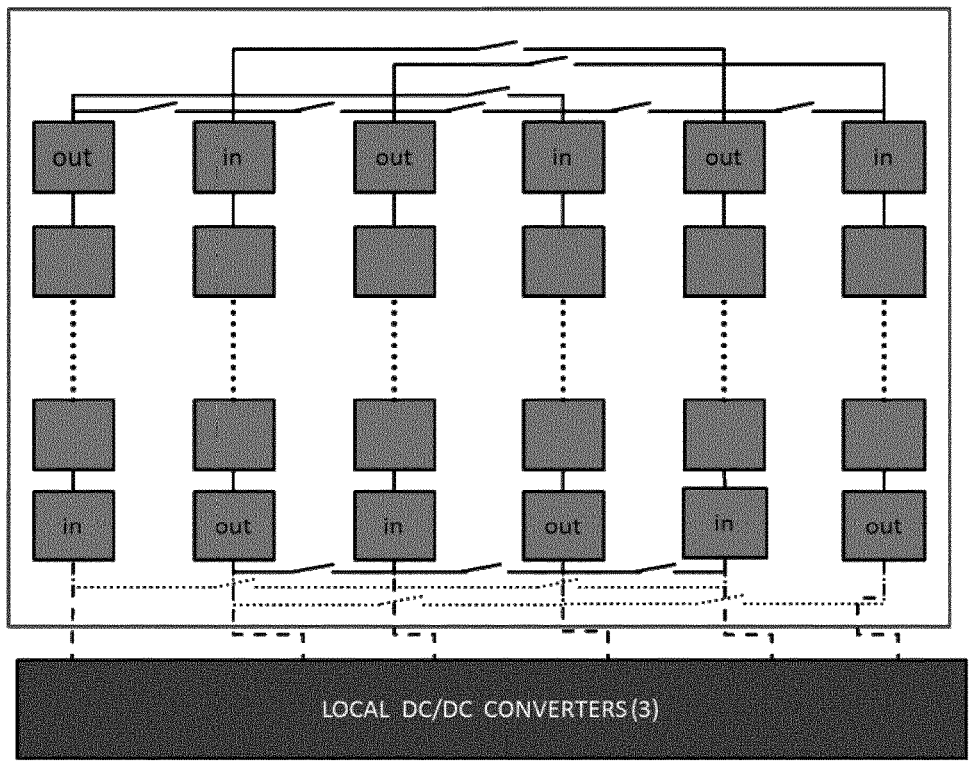
FIG. 17 shows in an embodiment of a parallel connection, the location of the local dc/dc converters allowing "all" wires to be removed from the top side of the PV module, enabling all acceptable configurations to be realizable.

In an embodiment of a parallel connection, the location of the local dc/dc converters allows "all" wires to be removed from the top side of the module, enabling all acceptable configurations to be realizable as before (see embodiment of FIG. 17).

However, as the converters can be on both sides of the module and the minimum input voltage is according to the type of converters used, the pruning of wires in these embodiments is a trade-off and not a constraint.

As shown in the previous figures, all inputs and outputs of potential "groups" ("sets") of substrings are connected to the local dc/dc converters. In a module of 6 substrings, which is used in the illustrations, three local converters are needed.

In embodiments of the present invention, it is possible to have all combinations of potential inputs and outputs connected to a converter. If substring 1 is connected in series with substring 2 as well as 3 with 4 and 5 with 6, all three converters are used simultaneously and the wires connecting the substrings with the in ports of the converters should allow this configuration. When the first four substrings are connected in series, the in port input 1-output 4 must be available. In all series connection, it is needed to connect input 1 and output 6 to the in port of a converter. So input 1 is potentially connected to all three outputs of the bottom side of the module. This also applies for the other two input pins (input 3 and input 4). In the case of an N by M module, at the bottom side of the module, where the converters are located, the inputs are all the odd numbered substrings and the outputs are all the even numbered substrings as shown in the embodiment of FIG. 17. If n is an input, it can potentially be combined, as an input to a converter, with output n+1, n+3, n+5 as well as n−1, n−3, n−5 in a specific run-time instantiation. This applies for all potential inputs of the module.

In order to allow all possible connections of the substrings to the converters, each potential input is connected to one converter and all potential outputs are connected to all the converters. This allows all possible combinations of input and output pairs to be connected to a converter.

Figure 18:
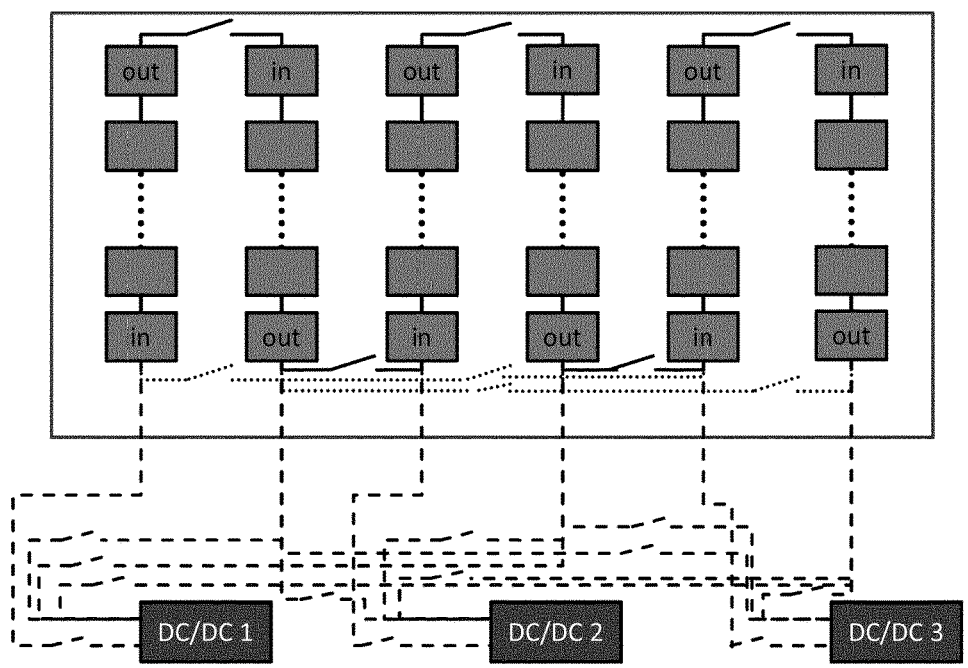
FIG. 18 shows a PV module with converters module in accordance with embodiments of the present invention.

In the embodiment of FIG. 18 a design instantiation is presented, where the wires which connect the substrings and the converters are shown. In this figure, the intra-converter connections are not illustrated.

Module with an odd number of substrings: it was stated before with respect to "selection of the substrings" that priority can be given either in having an even number of substrings, either in having the shortest substrings possible, which means that a module of 6 by 9 can have 9 substrings of 6 cells length. The substrings cannot be divided now in two equal sets according to the allowed current flow direction, as one set exceeds the other by one substring. The presence of an odd number of substrings indicates also that in a standard all in series connection of the substrings, the input and output of the module will be at different sides of the module. If no long wires are present, it means that one substring (from the larger set of substrings) will always be isolated from any electrical connection. In order to avoid that, at least one long wire should be added. If a long wire is added to connect the output of the last substring to the converters, the majority of the run-time instantiations that are described above can be realized. As the number of substrings is not even now, the number of converters is calculated as: (number of substrings+1)/2. The addition of this long wire, also allows the isolation of a single substring (which allows the same current flow as the last substring) and the connection of the last substring with a converter.

b. Intra Converter Connections

Figure 19:
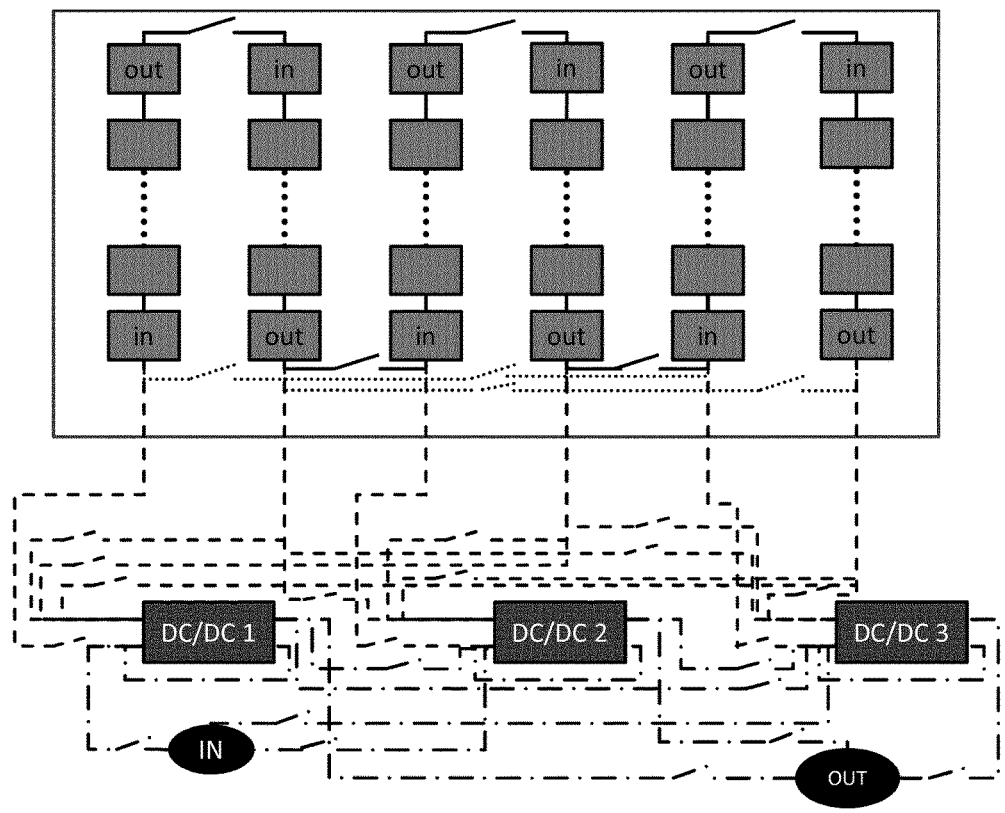
FIG. 19 shows a PV module with the connections of the substrings to the local converters and the intra-converter connections in accordance with embodiments of the present invention.
Figure 20:
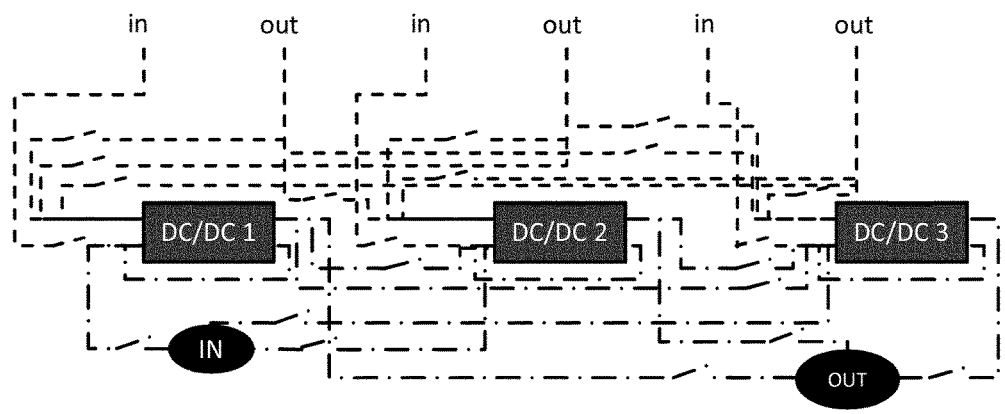
FIG. 20 shows a PV module with each potential input connected to one converter and all potential outputs connected to all the converters in accordance with embodiments of the present invention.

In the embodiments as shown in FIGS. 19 and 20, quite a lot of wires are connected to the converters. If it is considered that each "box" of a dc/dc converter includes the diodes necessary to allow parallel connection then all possible connections of the converters (both between the converters and between the converters and the substrings) without the module are shown in the embodiment of FIG. 20.

In FIG. 20, each potential input is connected to one converter and all potential outputs are connected to all the converters, as mentioned in the previous section. The converters can be connected with each other in series or in parallel. As every input is connected to just one converter, it is possible that converter 1 and 3 are in use. For that reason, there is also a wire connecting converters 1 and 3 in series, bypassing converter 2. All inputs of the converters are connected to the general input of the module and all outputs are connected to the general output of the module allowing parallel connection of the converters. All connections are controlled by switches. The connections to the general input and output also allow any set of converters to be in use in series connection.

Figure 21:
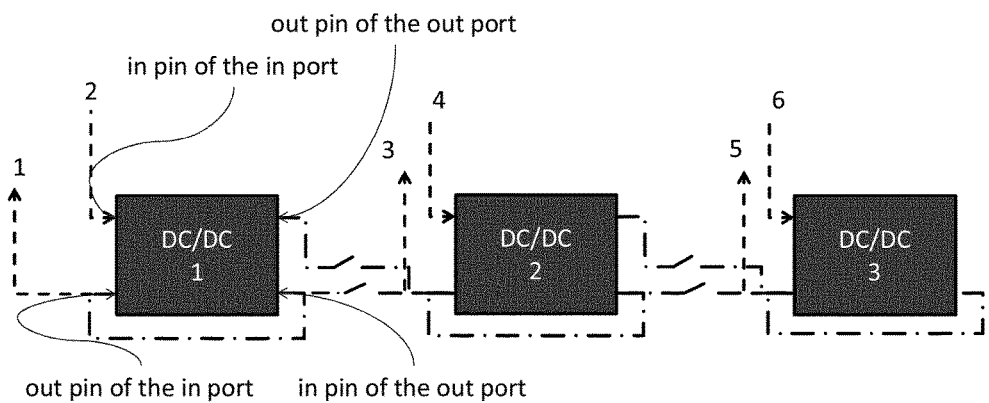
FIG. 21 shows a PV module with each input and output is connected to one converter in accordance with embodiments of the present invention.

In the embodiment of FIG. 21, each input and output is connected to one converter. The out pins of the in ports (which are the same as the in pins of the out ports) of the converters are connected with one another.

Figure 22:
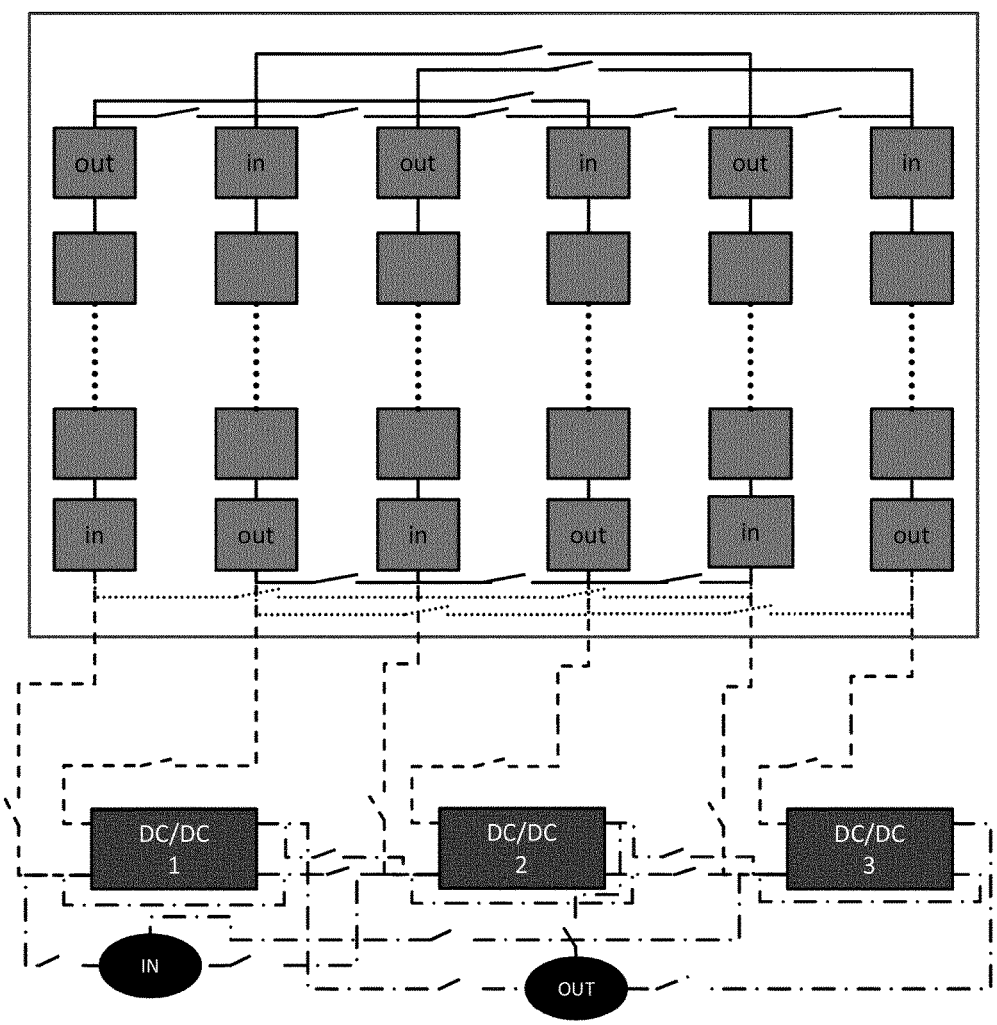
FIG. 22 shows a PV module with Parameterized topology with converters in accordance with embodiments of the present invention.

If the substrings are used in numerical order, no problem exists. Substrings 1 and 2 can be connected to converter 1, substrings 3 and 4 connected to converter 2 and substrings 5 and 6 connected to converter 3 and the converters can be then connected in any possible way (series, parallel or hybrid). It is also possible to connect substrings 1, 2, 3 and 4 in series with one converter. When the switch between converter 1 and 2 (the black wire) is closed, then the in pin of the first substring is transferred to the out pin of the in port of the second converter and 1 and 4 are connected to the same converters and only two converters are in use (2 and 3). If the groups of substrings "break" the numerical order, parallel connection of the converters is possible. For example, if substrings 1 and 4 have to be in the same group and 2 and 3 in another group, all three converters are in use at the same time and the switches between the converters all closed connecting them in parallel. In this case though, no option exists of having the converters connected in series (see the embodiment of FIG. 22).

Examples of Run-Time Instantiations of the Module

In the section where the connections of the substrings were described, the series and the parallel connections were discussed separately. In accordance with embodiments of the present invention, in a run-time instantiation of the module, it is possible to have a hybrid of those connections. Some groups of substrings can be connected in parallel and other in series. The decision of how to connect the substrings in each scenario depends on both the operating conditions of the substrings and the power demand. The connection of the substrings determines which converters will be in use at the specific scenario. As stated above, according to which converters are used, the possible intra converters connections may be limited. However, the converters can be connected in any way, which is legitimate, independently of the connections of the substrings.

Figure 23:
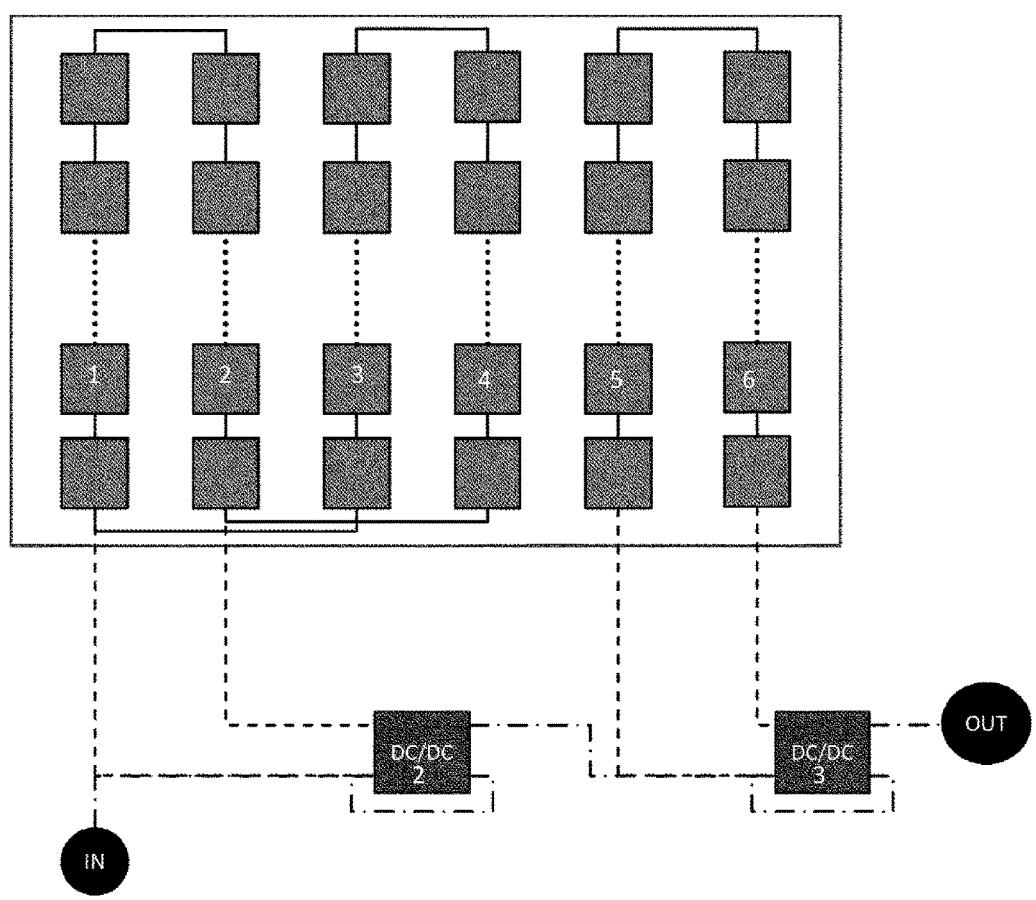
FIG. 23 shows a PV module with a hybrid arrangement in accordance with embodiments of the present invention. One group consists of substring pairs (1,2) and (3,4) which are connected in series and then in parallel, whereas the second group is substrings 5 and 6 in series.

In the embodiment of FIG. 23, one group consists of substring pairs (1,2) and (3,4) which are connected in series and then in parallel. The second group is substrings 5 and 6 in series. Each group is connected to a local converter. The converters which are used are number 2 and 3 and are connected in series (a parallel connection of the converters would also be possible with this grouping of the substrings).

Figure 24:
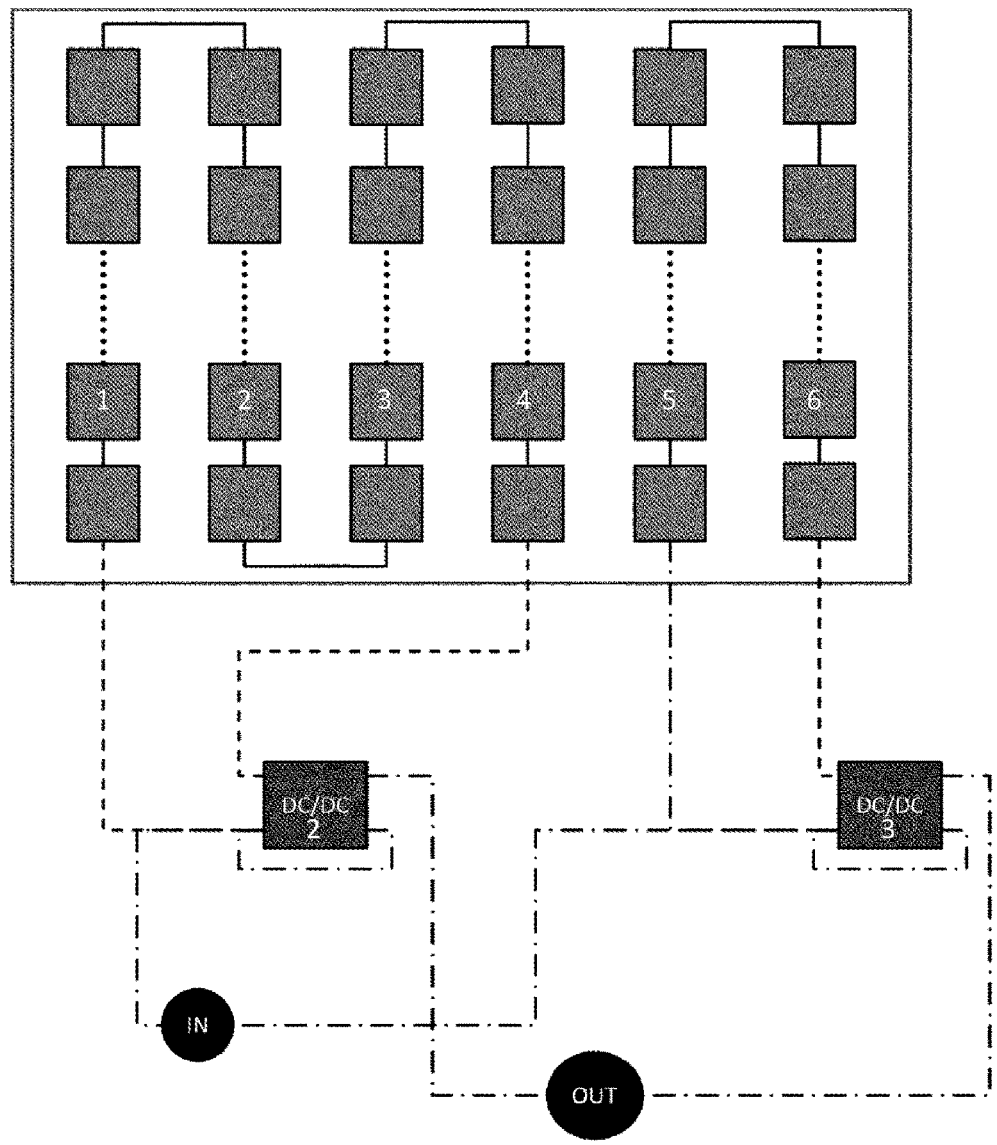
FIG. 24 shows a PV module arrangement in accordance with embodiments of the present invention in which substrings 1,2,3 and 4 are connected in series and connected to converter number 2, while substrings 5 and 6 are again connected in series and connected to converter 3, the converters between them being connected in parallel.

In the embodiment of FIG. 24, two groups of substrings are present. Substrings 1, 2, 3 and 4 are connected in series and connected to converter number 2, while substrings 5 and 6 are again connected in series and connected to converter 3. The converters between them are connected in parallel.

Vertical Split Topology a. Vertical Split: Basics

Up to this point, the configuration of the module which was described allows different run-time instantiations to exploit different illumination scenarios in the horizontal direction. If a shadow is moving only in the vertical direction, no run-time instantiation is present to improve the efficiency of the module. As mentioned above, in the section of "selection of the substrings", it is preferable to have the shortest dimension of the module to form the substrings in order to have less differentiations of irradiation in the vertical direction and less power loss due to vertical directed shading. However, some flexibility in the vertical direction is required and a vertical split of the substrings is considered.

The goal of the vertical split embodiments is to have a more adjustable module by dividing the substrings in the vertical direction. The concept of the vertical split naturally affects the decision of selecting in which dimension of the module the substrings will be formed.

Division of the Substrings and Connections of the Substrings

Figure 25:
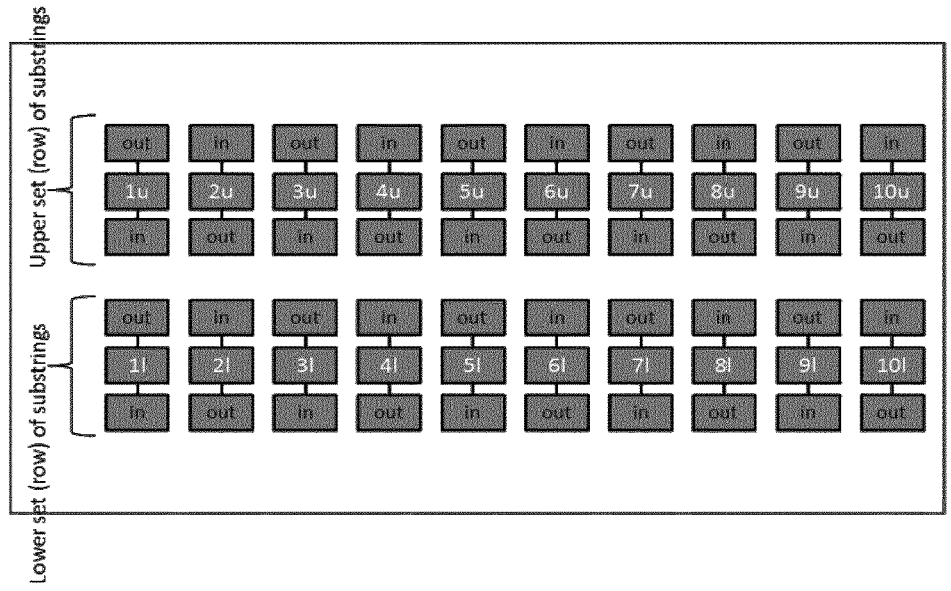
FIG. 25 shows an embodiment of a PV module with a vertical division of the substrings.

If a module of 10 by 6 is taken to account, the optimal choice, without having the vertical split applied, is to have 10 substrings of 6 cells length. An embodiment with a vertical division of the substrings leads to a module which has 20 substrings of 3 cells length. Each substring of the initial 10 substrings is divided in 2 substrings of 3 cells (see the embodiment of FIG. 25). The module now consists of two separate sets (rows) of substrings, the lower and upper set (row). The current flow is indicated by "in" and "out" at the two pins of each substring.

In this embodiment, the module can now be seen as two sub modules of 10 by 3. If each set of substrings is treated as a separate module on its own though, the wires required for all the connections described above (in the previous sections) would be twice the amount of the ones used before the vertical split, without even having the sub modules or sets of substrings interacting yet. All the wires which would be added contribute to the flexibility of the module to operate under different horizontal irradiation scenarios in which the vertical split is quite unnecessary. When the vertical split is applied, it is hence not useful to keep all the wire connections between the two horizontal sub modules so in embodiments with a vertical split it is preferred to prune heavily in those (see below). In contrast, the connections on the top and the bottom of the module (the top of the upper set of substrings and the bottom of the lower set of substrings correspondingly) are left as before, both for the series and parallel cases.

b. Vertical Split: Series Connections

In embodiments with a vertical split and series connections, in the middle of the module switches can be added in order to allow all substrings to be connected in series. In the case of uniformity in the vertical direction, these switches are constantly in the closed position, allowing the module to function as a module of 10 substrings. Wires are also added to enable the series connections of all the substrings of the upper and lower set correspondingly.

Figure 26:
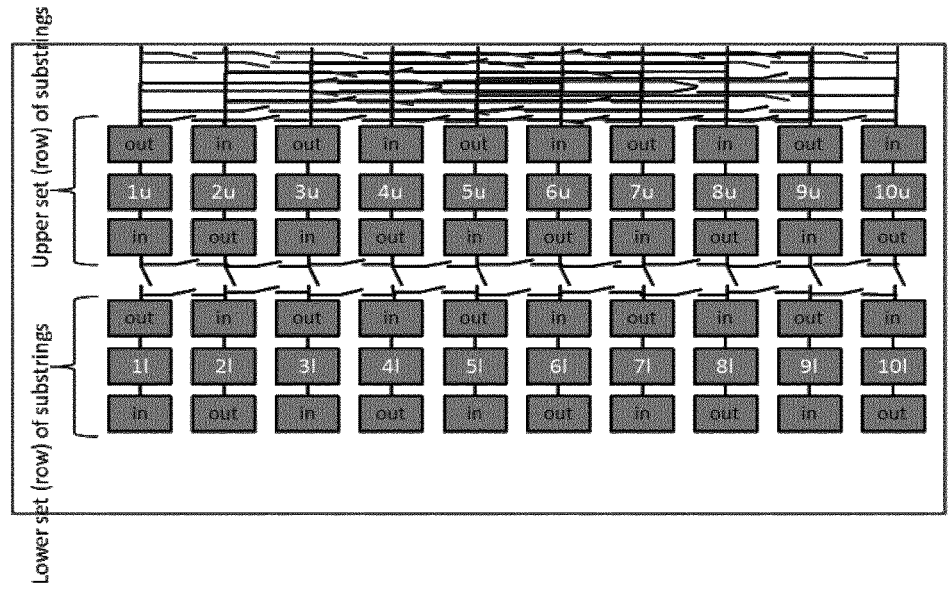
FIG. 26 shows an embodiment with a vertical division of a PV module with the substrings in series.

When the upper and lower set of substrings operate under different irradiation conditions, the two sets function independently. In order to allow some flexibility in case of a simultaneous horizontal differentiation of illumination, wires are added to connect all neighboring substrings in each set of substrings. The only interaction of the two sets is the potential connection of each Nl substrings with the substring Nu. The series connections of the module are shown in the embodiment of FIG. 26.

c. Vertical Split: Parallel Connections

Figure 27:
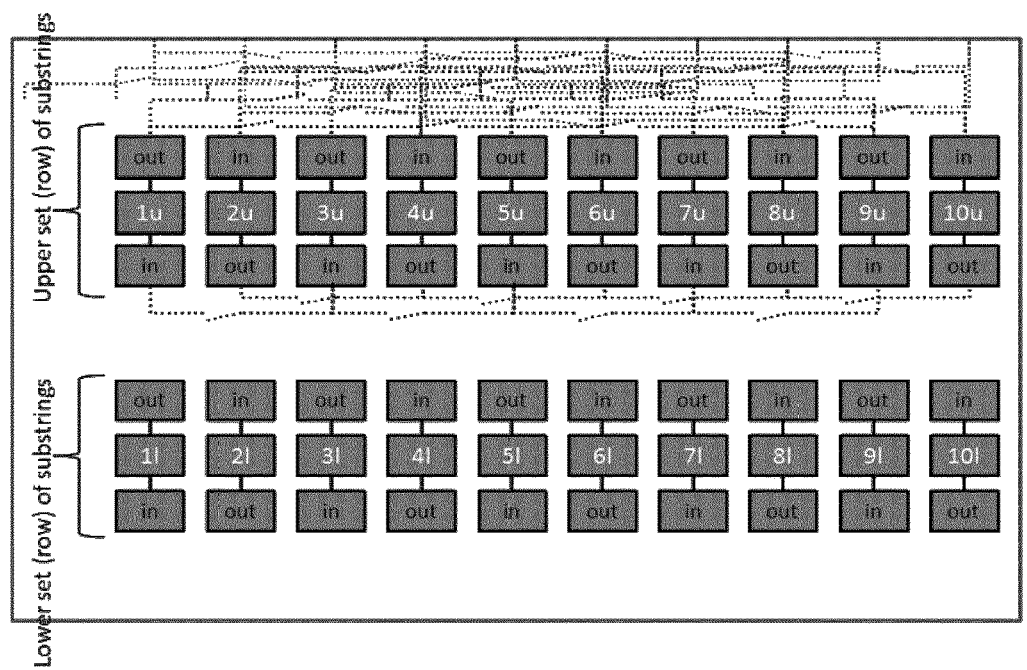
FIG. 27 shows an embodiment with a vertical division of a PV module with the substrings in parallel.

The interaction of the two sets of substrings through parallel connections would lead to an overhead which would not be compensated by the expected gain. In these embodiments of the present invention, the only wires which are added in the middle of the module aim at the increase of the flexibility of the module in the horizontal direction, when the vertical split is in use. The substrings of each row can potentially be connected in parallel with the nearest substring which allows the same direction of current flow. The parallel connections of the module are shown in the embodiment of FIG. 27.

Figure 28:
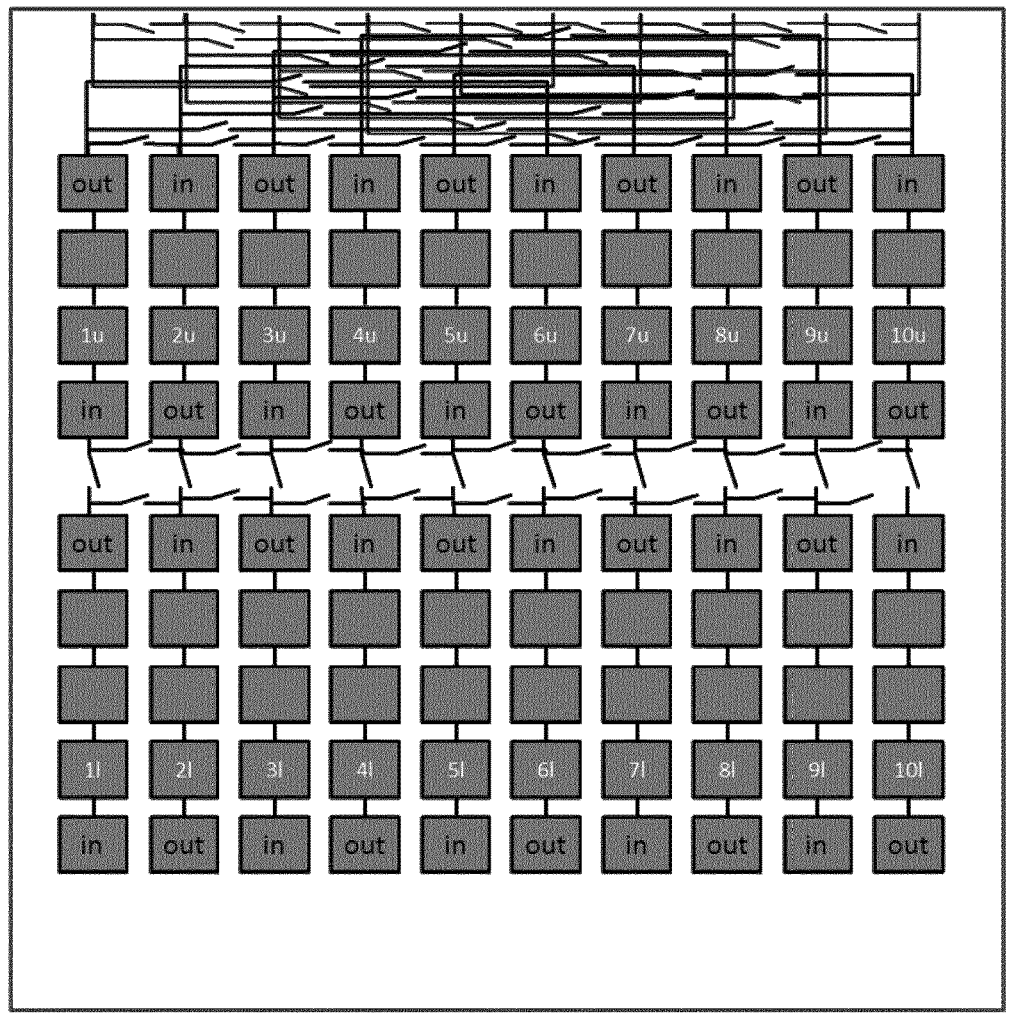
FIG. 28 shows an embodiment with a single split of the substrings, and the substrings are divided in two substrings.

In the example module which is used for illustration of the principles, with 10 columns of 6 cells, in this embodiment each column is divided in two substrings, leading to 20 substrings of 3 cells. A standard module size is considered to be 6 by 9. In the previous configurations analyzed above, either a division of the module into 6 substrings of 9 cells length or into 9 substrings of 6 cells length has been introduced. If the vertical split is to be applied in an embodiment of the 6 by 9 module, it can be preferable to have a shorter substring length to begin with. If the module is organized to have 9 substrings of 6 cells length, the vertical split would be similar to the one previous described. Each substring would be divided in two substrings of three cells. That of course would mean that an odd number of columns is present, which implies that in the all series connection, the in and the out pin of the module would be located on different sides of the module. In that case, a consideration is needed on which long wires should be present in order to have the widest coverage of all plausible irradiation scenarios with the minimum addition of extra wires and components. In the case that changing the direction of electrical connection of the cells within the module is not acceptable, the vertical split is applied to substrings of 9 cells. In one embodiment there is a single split of the substrings, and the substrings are divided in two substrings of 5 and 4 cells with the same connections between the sets of substrings as described above (see the embodiment of FIG. 28).

Figure 29:
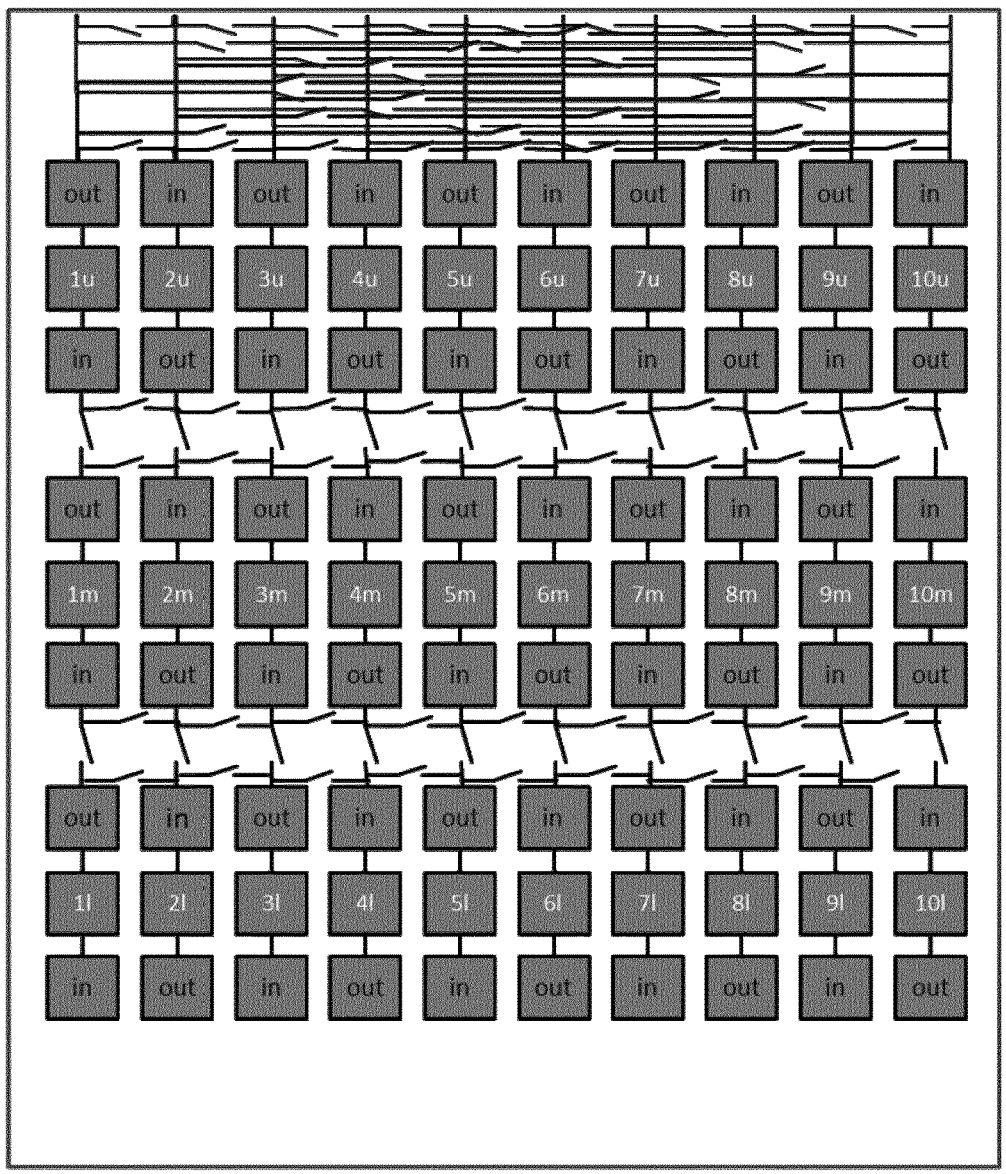
FIG. 29 shows a PV module with three sets of substrings, the upper (u), the middle (m) and the lower (l) set in accordance with embodiments of the present invention.

A length of 9 cells means that more irradiation differentiations can be present in that dimension, compared to one of 6 cells. In further embodiments a further split of the cells in the vertical direction could hence be applied, leading to three substrings of three cells in each column. The module would have three sets of substrings, the upper (u), the middle (m) and the lower (l) set. The series and parallel connections in between the sets of substrings would be the same as analyzed in the case of the 10 by 6 module (see the embodiment of FIG. 29).

In conclusion, the vertical split does not necessary mean that there is a single division by two of the original substrings in embodiments of the present invention. Further divisions can be made if it is necessary or useful. A minimum amount of cells in a substring should be assigned though, in order not to have a large overhead due to the additional wires required for all the potential connections. A proposed minimum is 2-3 cells per substring.

Vertical Split: Converters

It has been mentioned above with respect to the converters in the regular topology, that the number of local dc/dc converters is computed through the formula (number of substrings)/2. This formula in combination with the absence of long connections and with an even number of substrings means that a single substring cannot be isolated. When the vertical split is applied to a module of 6 by 10, the result is having 20 substrings. According to the formula above, the number of local dc/dc converters needed is 10. The converters can either be divided to be situated on both sides of the module, either concentrated on one side of the module.

Converters on Both Sides of the Module

Figure 30:
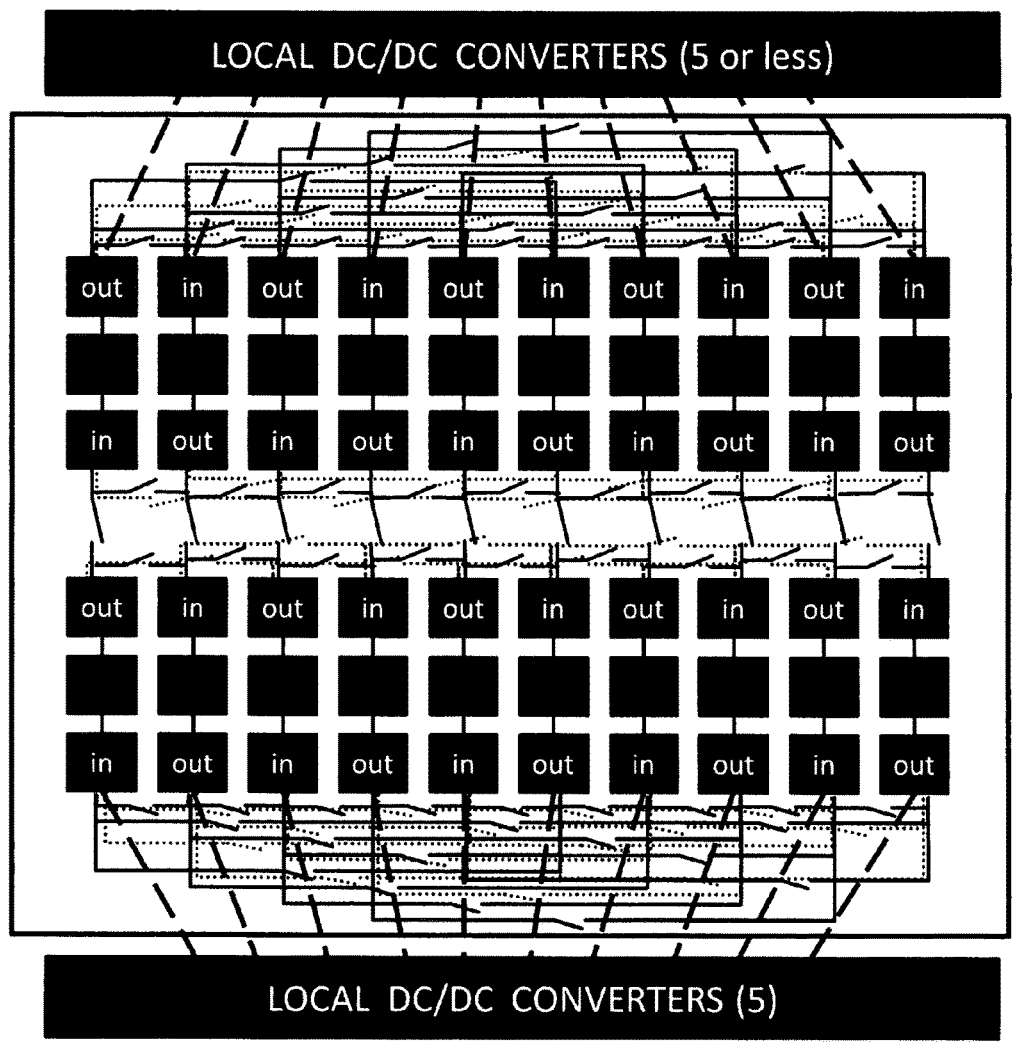
FIG. 30 shows a PV module in accordance with an embodiment of the present invention with less converters placed on the top side of the module resulting in a non-symmetric or non-uniform module.

It is expected to have non uniform irradiation either mainly in the horizontal direction either mainly in the vertical direction. A superimposition of both is possible, but a checkerboard irradiation scenario is considered quite improbable. As mentioned earlier on, in the case of vertical directed irradiation differences the independence of the sets of substrings is necessary. If irradiation only changes in the vertical direction, the number of converters which are needed is equal to the number of sets of the substrings of the module. In the case of the 6 by 10 module, two converters will be used in such a scenario, one converter from the top side and the other from the bottom side of the module. In horizontal irradiation scenarios the module will function as before the vertical split, using mainly the converters which are situated on the bottom side of the module. For that reason and in order to reduce the overhead, in embodiments of the present invention less converters should be placed on the top side of the module resulting in a non-symmetric or non-uniform module. All input and output pins (which are either at the top or the bottom of the module, not in the middle part) of the substrings are connected to the converters. The converter connections are as described in the "Intra-converter connections" section. In the embodiment shown in FIG. 30 the connections of the module are shown, while the converters are not analytically illustrated.

Although converters are present both at the top and the bottom of the module, the input pins for each converter must be at the same side of the module, as no long wires exist resulting in a non-symmetric or non-uniform module. In the case where irradiation changes simultaneously both on the vertical and horizontal direction, the module can be divided in two by enabling the vertical split and then the two sets of substrings can be treated independently to taking into consideration the differences of horizontal operating conditions. Each set of substrings uses the converters on the corresponding side of the module. Another option in such a scenario is to apply the vertical split only at the part of the module which can be affected by vertical irradiation changes, if that is possible. If for example, irradiation changes vertically just at the 4 first columns of the module, then the vertical split can be applied just there, while the other columns of the module (5 to 10) are not divided as the irradiation in the vertical direction is uniform.

It was mentioned above that each set of substrings is connected to its "own" converters on one side of the module. In the case where the rows or columns of the module are divided by 3, the result is 3 separate sets of substrings: the upper, the middle and the lower set. Each set shares equal number of substrings, but only the substrings which belong either to the upper or lower part of the module have pins on the edge of the module where local converters are potentially located. Placing converters to the middle part would require a much higher technological effort, increased cost and will probably not lead to the desired results. If it considered necessary to have the option of connecting substrings which belong to the middle set of the module with a converter, it is better to add some long wires. If no such option is required, the substrings in the middle part will directly be connected to the upper part or the lower part of the module. For that reason, the substrings which belong to the middle set of the module are not taken into account whilst computing the total number of substrings of the module.

Converters on One Side

The extreme case of reducing the local converters at the top of the module is to have converters just on one side of the module, the bottom side resulting in a non-symmetric or non-uniform module. The horizontal irradiation differentiations would be treated in the same way, as explained earlier on, with no additional wires needed. If the vertical split is applied though, input and output pins are situated on both sides of the module from both sets of substrings (upper and lower). This can be compensated by allowing the existence of some long wires which are crossing the module, allowing the "pins" of the substrings on the top side of the module to connect to converters at the bottom side of the module. This configuration is no longer symmetrical at all in the vertical direction and it leads to a highly non-uniform module. Not all the in and out pins of the substrings on the top of the module will be potentially connected to the converters. The input and output pins which are close to the edges (left and right) should be connected to the converters. An issue is raised here though, namely whether in this case the wires should be added to connect the in and out pins of the upper substrings on the top of the module or the middle of the module with the converters. If the wires are added to the top, the functionality of the module can be the same as described before, otherwise the functionality slightly differs. In the first case, the top side of the uppers set of substrings, which also has the most connections, is connected to the converters, while in the second case the middle side that has less connections is connected to the converters. As analyzed before, the second case is preferable for the series connection of the substrings. A hybrid of the addition of wires can be considered as well, as it can possibly lead to more flexibility.

Figure 31:
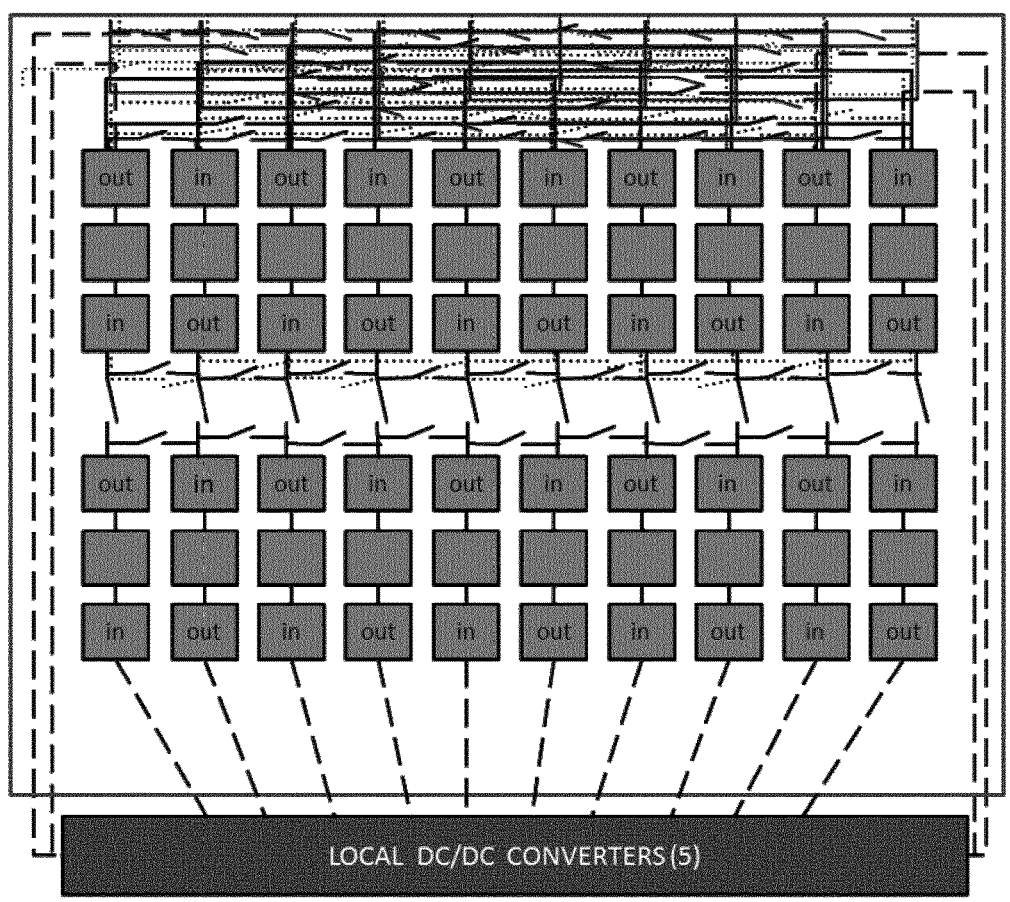
FIGS. 31 and 32 show PV modules in accordance with embodiments of the present invention with long wires connecting the pins on the top of the module and the middle of the module.
Figure 32:
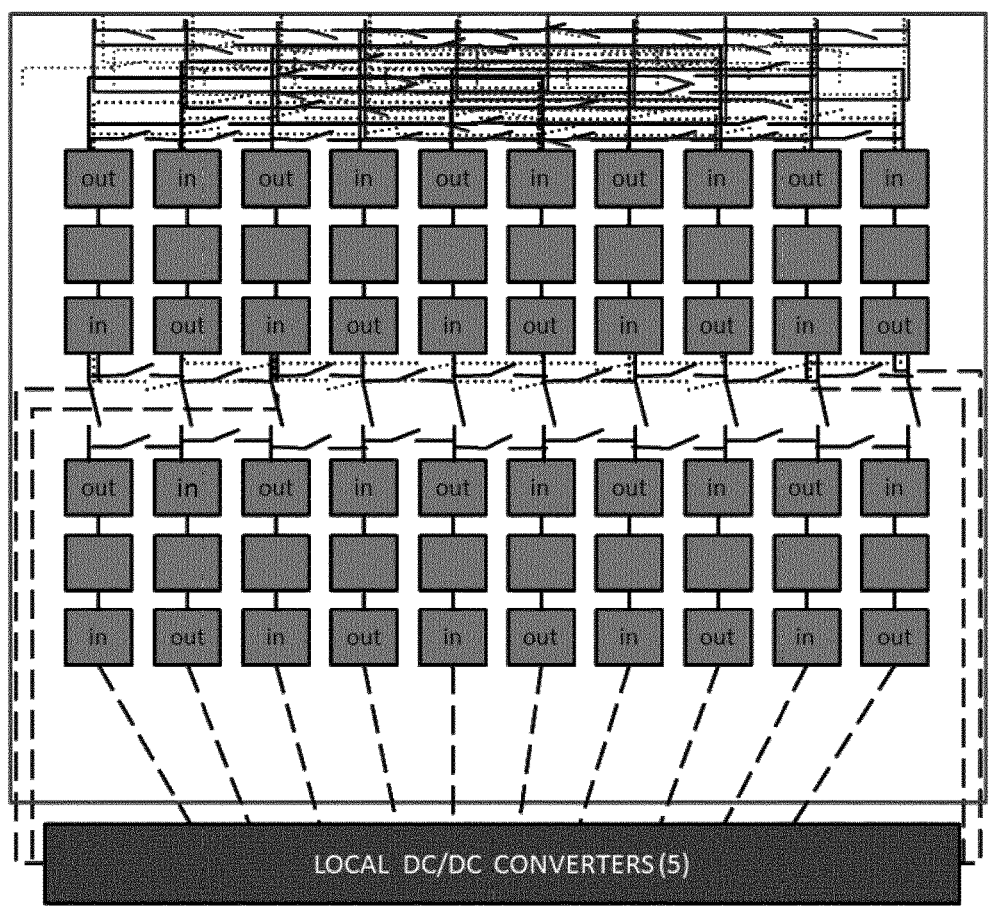

The long wires that are shown in the embodiments of FIGS. 31 and 32 are chosen arbitrarily and just indicate how the wires will be placed if the wires connect the pins on the top of the module and the middle of the module correspondingly. Which pins will be connected depends mainly on the cost requirements and on the frequency of each irradiation scenario. The dashed wires which are shown in the embodiments of FIGS. 31 and 32 indicate that on that position a switch is present which is not shown.

The removal of the converters on the top and the addition of some long wires which are crossing the module, apart from the reduction of the overhead, allows also the electrical isolation of just one column of cells. The two pins which are used for the in port of the converter can be connected from different sides of the module. This means that if column 1 of the module needs to be removed, the input can be at the bottom of column 10 and the output on the top of column 2.

Figure 33:
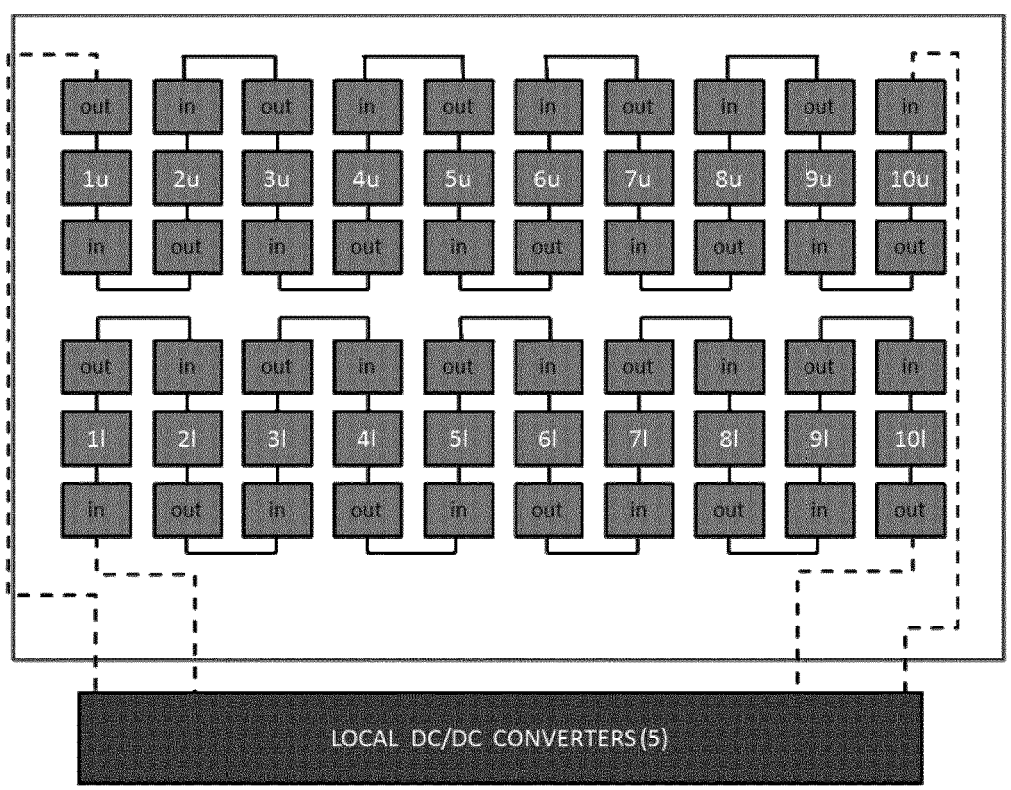
FIG. 33 shows an embodiment with the module is divided in two sub modules.

Examples of Run-Time Instantiations of the Module with Application of the Vertical Split In the embodiment of FIG. 33, there is just a vertical irradiation changing, so the module is divided in two sub modules. As the converters are located at the bottom of the module, long wires are used in order to connect the upper sub module to the converters. In this case, the long wires connect the converters with the in and out pins of the upper substrings which are situated at the top side of the module.

Figure 34:
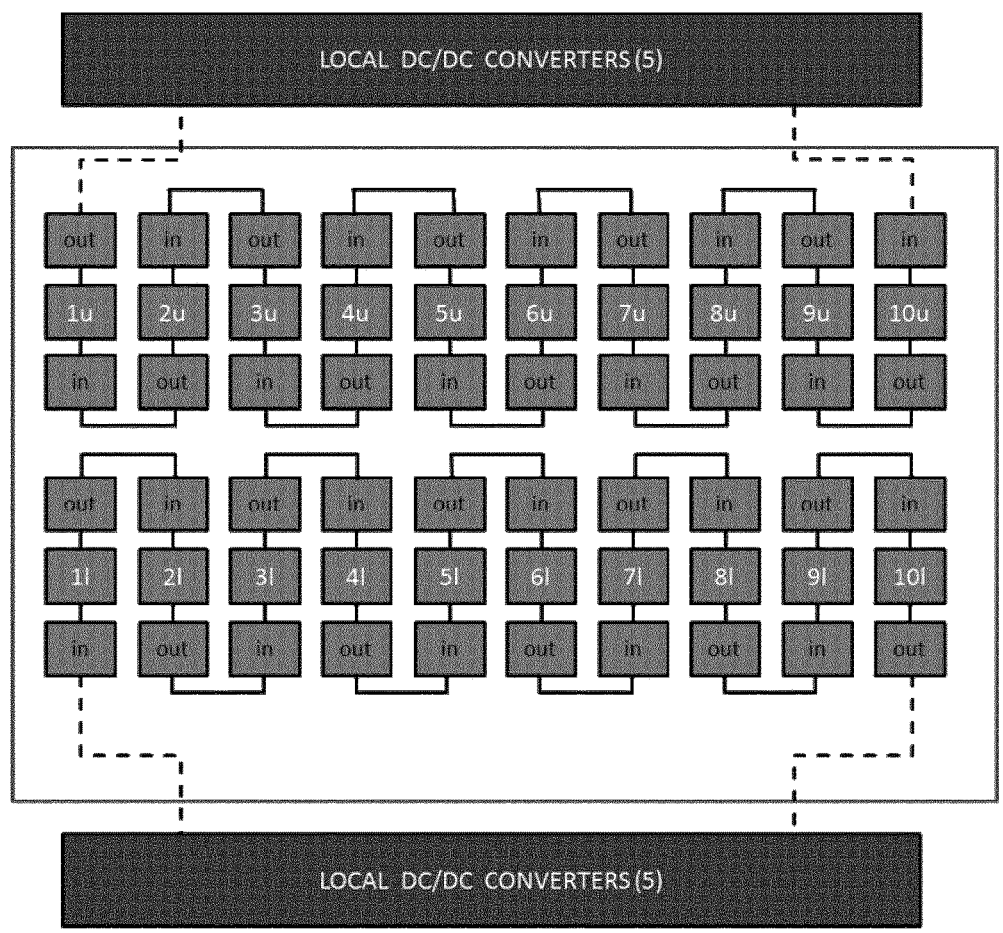
FIG. 34 shows an embodiment of a PV module where converters are located on both sides of the module.

In the embodiment of FIG. 34, the connections are shown in the same shading conditions where converters are located on both sides of the modules.

Figure 35:
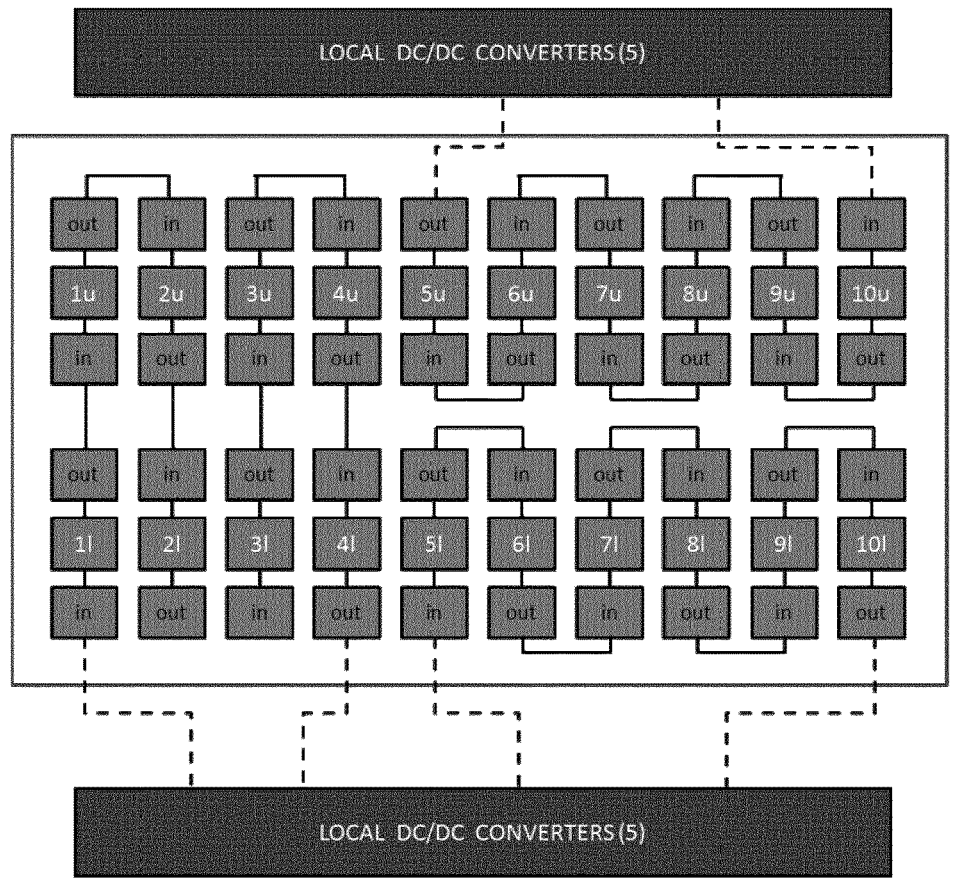
FIG. 35 shows an embodiment of a PV module with one converter on the top side and two converters on the bottom side.

In the embodiment of FIG. 35 converters are located on both sides of the module. The first four columns of the module are not likely to be affected by vertical shading, so the vertical split is not applied in that part of the module. The rest of the module is divided. Three converters are required for this grouping of the substrings, one converter from the top side and two converters from the bottom side resulting in a non-symmetric or non-uniform module. If no converters were placed on the top side of the module, long wires would be needed to connect the upper set of substrings with the converters at the bottom of the module.

Actively Controlled Bypass Diodes

Figure 36:
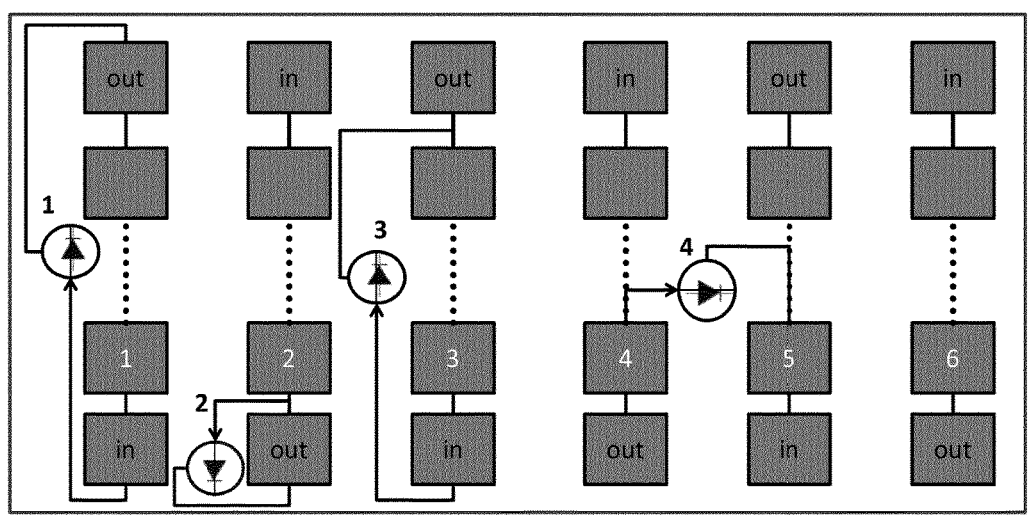
FIG. 36 shows the principles of placing diodes in a PV module in accordance with embodiments of the present invention.

An actively controlled bypass diode is a diode which allows a controllable specific amount of current to flow. In comparison with a normal bypass diode, the current which is bypassed through an actively controlled bypass diode is controllable. From now on, the term bypass diode will be used to refer to an actively controlled bypass diode. The objective of the proposed topology is, as mentioned earlier, the separation of the module into groups of cells which produce either the same amount of current or voltage (series and parallel connections). In the run-time variable ("knob-controlled") topology which was described above, the smaller component of the module which can be selected to belong or not to a specific group is a substring and not a single solar cell. Even more, a substring preferably has to belong to a group of at least two substrings. In the case where a single substring or a smaller number of cells operate under different conditions than the rest of the module, these cells affect the operation of at least one more substring. If a bypass diode is placed in parallel with those cells, the excess current will flow through the diode, allowing the rest of the cells to produce their maximum power. It is evident that there are several potential positions where bypass diodes can be placed on the module. In principle, diodes could potentially connect any two cells of the module, but it is not cost effective to have a diode connecting two cells where an especially long wire or crossing of other wires is required. In the embodiment of FIG. 36 the principles of placing the diodes are illustrated. Under full or uniform irradiation conditions, all bypass diodes are inactive. The diodes are not electrically disconnected by a switch, but by the alteration of their intrinsic resistance which is controllable.

In embodiments of the present invention positions of the actively controlled bypass diodes can be as follows:

1. Across a substring: In the connections described in the previous sections, it has been noted that it is not possible to disconnect a smaller number of cells than a pair of substrings. Actively controlled bypass diodes can be used in order to remove just one substring or to enable the connection of two or more substrings which produce different current by allowing the excess current to flow through the diode.
2. Across a single cell. This case is too fine-grained and can be proven to add too much cost, thus will not be considered any further.
3. Across a number of cells within a substring. That can potentially be useful still but even that will usually be too costly compared to the potential energy-yield gain expectation.
4. Connecting neighboring substrings. This option will potentially be useful, if irradiation conditions are expected that are covering a section of the substrings from the connected set.

Figure 37:
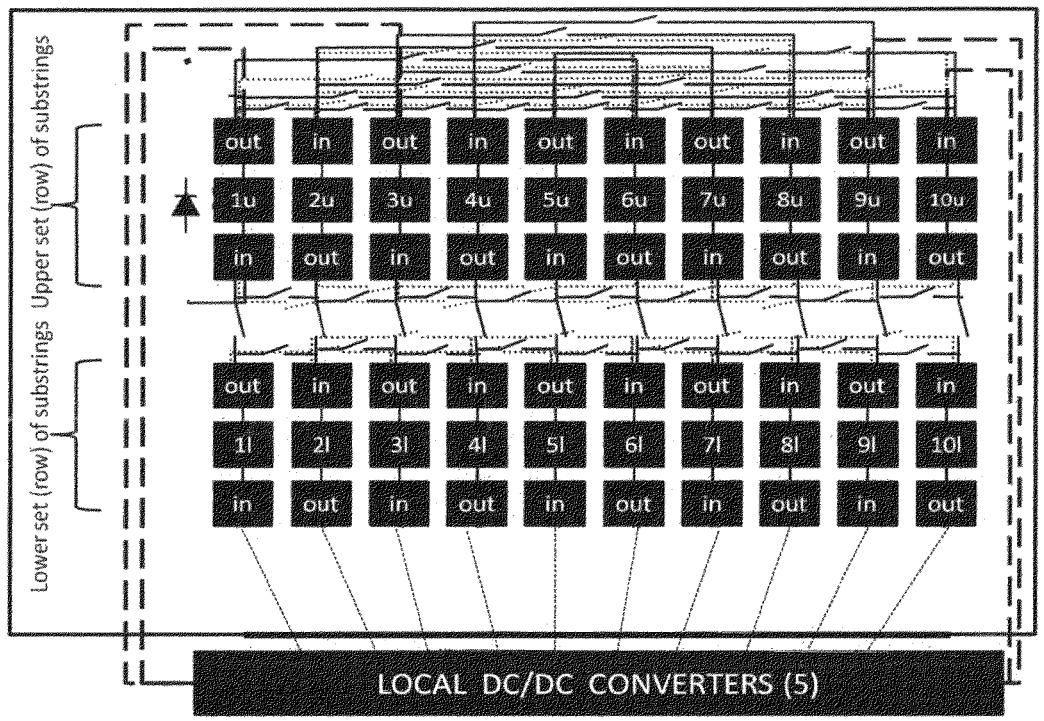
FIG. 37 shows a PV module with a complete parameterized topology.

FIG. 37 shows all possible hybrids available in the complete parameterized topology.

Embodiments of the present invention provide templates that have been illustrated and can be combined in order to have different real physical configurations, which allows more flexibility. The concept of the flexible/hybrid series or parallel substring connections, the placement of the local dc/dc converters, the vertical split options, and the active controlled bypass diodes can be combined in a very flexible way to increase the overall efficiency of the module. It is important to include the constraints propagated in a uni-directional way between these different options while combining them.

These design methods can be implemented on a computer by providing software, e.g. as module that when run on a computer allows planning and/or designing a PV module. The software is adapted such that when run on a computer it allows selecting or determining of a combination of features of the present invention, e.g. the best approach to optimise cost, efficiency and flexibility. The computer system can comprise an expert system set up to propose a design automatically given input constraints.

The computer can comprise a processor and a memory which stores machine-readable instructions (software as described above) which, when executed by the processor cause the processor to perform the described methods. The computer may be implemented as a general purpose computer, e.g. a UNIX workstation or a personal computer.

The computer typically includes a Central Processing Unit ("CPU"), such as a conventional microprocessor of which a Pentium processor supplied by Intel Corp. USA is only an example, and a number of other units interconnected via bus system. The bus system may be any suitable bus system. The computer includes at least one memory. Memory may include any of a variety of data storage devices known to the skilled person such as random-access memory ("RAM"), read-only memory ("ROM"), and non-volatile read/write memory such as a hard disc as known to the skilled person. For example, the computer may further include random-access memory ("RAM"), read-only memory ("ROM"), as well as a display adapter for connecting the system bus to a video display terminal, and an optional input/output (I/O) adapter for connecting peripheral devices (e.g., disk and tape drives) to the system bus. The video display terminal can be the visual output of computer, and can be any suitable display device such as a CRT-based video display well-known in the art of computer hardware. However, with a desk-top computer, a portable or a notebook-based computer, the video display terminal can be replaced with a LCD-based or a gas plasma-based flat panel display. The computer further includes an user interface adapter for connecting a keyboard, mouse, and optional speaker.

The computer can also include a graphical user interface that resides within machine-readable media to direct the operation of the computer. Any suitable to machine-readable media may retain the graphical user interface, such as a random access memory (RAM), a read-only memory (ROM), a magnetic diskette, magnetic tape, or optical disk (the last three being located in disk and tape drives). Any suitable operating system and associated graphical user interface (e.g., Microsoft Windows, Linux) may direct CPU. In addition, computer includes a control program that resides within computer memory storage. Control program contains instructions that when executed on CPU allow the computer to carry out the operations described with respect to any of the methods of the present invention.

The graphical user interface is used to visualize the PV module as it is being developed. It can also be used for planning and/or designing and can be adapted to simulate run-time operation of the module under varying lighting conditions, e.g. for visualising qualitative and/or quantitative feedback about the effect of the planned/simulated PV module and it can also be used for visualizing the selecting or determining of an approach or the best approach for the design.

Those skilled in the art will appreciate that other peripheral devices such as optical disk media, audio adapters, or chip programming devices, such as PAL or EPROM programming devices well-known in the art of computer hardware, and the like may be utilized in addition to or in place of the hardware already described.

The computer program product for carrying out the method of the present invention can reside in any suitable memory and the present invention applies equally regardless of the particular type of signal bearing media used to actually store the computer program product. Examples of computer readable signal bearing media include: recordable type media such as floppy disks and CD ROMs, solid state memories, tape storage devices, magnetic disks.

Accordingly, the present invention also includes a software product which when executed on a suitable computing device carries out any of the methods of the present invention. Suitable software can be obtained by programming in a suitable high level language such as C and compiling on a suitable compiler for the target computer processor.

The invention claimed is:

1. A photovoltaic module comprising:
an array of a plurality of photovoltaic cells, wherein the photovoltaic cells are arranged in substrings, each substring comprising at least two photovoltaic cells, and the photovoltaic cells within a respective substring are non-divisibly joined in series, and the array has an initial configuration and a run-time configuration, wherein the initial configuration and the run-time configuration are non-uniform;
local DC-DC converters integrated within the photovoltaic module and directly connectable to the sub strings of photovoltaic cells; and
a plurality of switches integrated within the photovoltaic module and located between the substrings and the DC-DC converters, wherein the plurality of switches is selectively controlled to reconfigure the array into the non-uniform run-time configuration by forming direct connections of two or more substrings, wherein the direct connections comprise at least one of (a) a direct parallel connection of the two or more substrings, (b) a direct series connection of the two or more substrings, or (c) a hybrid connection of the two or more sub strings,
wherein the array is responsive to a non-uniform photonic stimulation by a non-uniform re-arrangement of the direct connections of the substrings.

2. The photovoltaic module of claim 1, wherein the array comprises at least one parallel connection of two or more substrings and at least one series connection of two or more substrings.

3. The photovoltaic module of claim 1, wherein one or more of the plurality of switches is located between two or more of the DC-DC converters.

4. The photovoltaic module of claim 1, further comprising one or more actively-controlled bypass diodes arranged to allow excess current to flow in an occurrence of a mismatch of currents between a substring and at least one of the DC-DC converters.

5. The photovoltaic module of claim 4, wherein the one or more actively-controlled bypass diodes are placed across one of the substrings.

6. The photovoltaic module of claim 4, wherein the one or more actively-controlled bypass diodes are placed across one or more of the photovoltaic cells included in the plurality of photovoltaic cells.

7. The photovoltaic module of claim 4, wherein the one or more actively-controlled bypass diodes are placed across one or more of the photovoltaic cells within one of the substrings.

8. The photovoltaic module of claim 4, wherein the one or more actively-controlled bypass diodes are placed across two or more adjacent substrings.

9. The photovoltaic module of claim 1, wherein at least one of:
(i) wired connections to DC-DC converters are substantially on one side of the photovoltaic module, or
(ii) one or more connections between up-going substrings and down-going substrings are paired.

10. The photovoltaic module of claim 1, wherein the connections include one or more hybrid connections, and wherein at least one of:
(i) wired connections do not cross from one side of the photovoltaic module to another side of the photovoltaic module, or
(ii) one of the DC-DC converters is connected to a group of connections that starts with one of one or more hybrid connections, wherein non-uniform stimulation conditions are used to identify a non-uniform subset of substrings.

11. The photovoltaic module of claim 1, wherein at least one of:
(i) the DC-DC converters are located on one side of the photovoltaic module, or
(ii) each of the DC-DC converters are connected to an even number of substrings.

12. The photovoltaic module of claim 1, wherein N is a number of the DC-DC converters, M is a number of substrings in the array, and N is less than or equal to M/2, wherein M and N are positive integers.

13. The photovoltaic module of claim 1, wherein each of the DC-DC converters is connected to a grouping of sub strings, and wherein the DC-DC converters are connected in series by one or more switches.

14. The photovoltaic module of claim 1, wherein:
if the photovoltaic module is split in a non-uniform vertical split, then the DC-DC converters are placed on one or more sides of the photovoltaic module, and
if the photovoltaic module is not split in the non-uniform vertical split, then the DC-DC converters are placed in a middle of the photovoltaic module between split parts of the photovoltaic module.

15. The photovoltaic module of claim 1, further comprising one or more bypass diodes, wherein each bypass diodes provides at least one of:
   (i) a current bypass across at least one of a grouping of sub strings,
   (ii) a current bypass across at least one substring, or
   (iii) a connection between two adjacent substrings.

16. The photovoltaic module of claim 1, wherein:
   a number of substrings of the photovoltaic module is N, wherein N is a positive integer,
   if N is even, the DC-DC converters comprise a maximum of N/2 DC-DC converters, and
   if N is odd, the DC-DC converters comprise a maximum of N/2+½ DC-DC converters.

* * * * *